United States Patent
Lee et al.

(10) Patent No.: US 12,408,315 B2
(45) Date of Patent: *Sep. 2, 2025

(54) FLEXIBLE MERGE SCHEME FOR SOURCE/DRAIN EPITAXY REGIONS

(71) Applicant: Taiwan Semiconductor Manufacturing Co., Ltd., Hsinchu (TW)

(72) Inventors: Kai-Hsuan Lee, Hsinchu (TW); Chia-Ta Yu, New Taipei (TW); Cheng-Yu Yang, Xihu Township (TW); Sheng-Chen Wang, Hsinchu (TW); Sai-Hooi Yeong, Zhubei (TW); Feng-Cheng Yang, Zhudong Township (TW); Yen-Ming Chen, Chu-Pei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/517,275

(22) Filed: Nov. 22, 2023

(65) Prior Publication Data

US 2024/0098959 A1 Mar. 21, 2024

Related U.S. Application Data

(60) Continuation of application No. 17/234,201, filed on Apr. 19, 2021, now Pat. No. 11,856,743, which is a
(Continued)

(51) Int. Cl.
*H10D 62/13* (2025.01)
*H01L 21/027* (2006.01)
(Continued)

(52) U.S. Cl.
CPC .......... *H10B 10/12* (2023.02); *H01L 21/0273* (2013.01); *H01L 21/30604* (2013.01);
(Continued)

(58) Field of Classification Search
CPC ............ H01L 27/1104; H01L 27/1116; H01L 27/0886; H01L 27/0924; H01L 21/823418;
(Continued)

(56) References Cited

U.S. PATENT DOCUMENTS 8,836,016 B2 9/2014 Wu et al.
8,841,701 B2 9/2014 Lin et al.
(Continued)

FOREIGN PATENT DOCUMENTS

CN 103681347 A 3/2014
CN 105977159 A 9/2016
(Continued)

*Primary Examiner* — Michael M Trinh
(74) *Attorney, Agent, or Firm* — Slater Matsil, LLP

(57) ABSTRACT

A method includes etching a first semiconductor fin and a second semiconductor fin to form first recesses. The first and the second semiconductor fins have a first distance. A third semiconductor fin and a fourth semiconductor fin are etched to form second recesses. The third and the fourth semiconductor fins have a second distance equal to or smaller than the first distance. An epitaxy is performed to simultaneously grow first epitaxy semiconductor regions from the first recesses and second epitaxy semiconductor regions from the second recesses. The first epitaxy semiconductor regions are merged with each other, and the second epitaxy semiconductor regions are separated from each other.

20 Claims, 33 Drawing Sheets

Related U.S. Application Data continuation of application No. 16/669,736, filed on Oct. 31, 2019, now Pat. No. 10,985,167, which is a continuation of application No. 16/206,183, filed on Nov. 30, 2018, now Pat. No. 10,529,725, which is a division of application No. 15/492,142, filed on Apr. 20, 2017, now Pat. No. 10,483,266.

(51) Int. Cl.

| | | |
|---|---|---|
| *H01L 21/306* | (2006.01) | |
| *H01L 21/311* | (2006.01) | |
| *H10B 10/00* | (2023.01) | |
| *H10D 62/00* | (2025.01) | |
| *H10D 62/822* | (2025.01) | |
| *H10D 64/01* | (2025.01) | |
| *H10D 84/01* | (2025.01) | |
| *H10D 84/03* | (2025.01) | |
| *H10D 84/85* | (2025.01) | |

(52) U.S. Cl.
CPC ... *H01L 21/31111* (2013.01); *H01L 21/31144* (2013.01); *H10B 10/18* (2023.02); *H10D 62/021* (2025.01); *H10D 62/151* (2025.01); *H10D 64/021* (2025.01); *H10D 84/013* (2025.01); *H10D 84/0135* (2025.01); *H10D 84/0158* (2025.01); *H10D 84/0193* (2025.01); *H10D 84/038* (2025.01); *H10D 84/853* (2025.01); *H10D 62/822* (2025.01); *H10D 84/017* (2025.01)

(58) Field of Classification Search
CPC ..... H01L 21/823425; H01L 21/823431; H01L 21/823821; H01L 21/823814; H01L 21/823468; H01L 29/0847; H01L 29/6656; H01L 29/165; H10B 10/12; H10B 10/18; H10B 10/10; H10B 99/00; H10B 12/10; H10B 20/10; H10D 62/021; H10D 62/151; H10D 62/235; H10D 62/822; H10D 62/83; H10D 64/021; H10D 64/017; H10D 84/013; H10D 84/0135; H10D 84/0158; H10D 84/0193; H10D 84/038; H10D 84/01; H10D 84/853; H10D 84/8311; H10D 84/8312; H10D 84/83135; H10D 84/83138; H10D 84/8314; H10D 84/8316; H10D 84/835; H10D 84/836; H10D 84/837; H10D 84/839; H10D 84/851; H10D 84/852; H10D 84/017; H10D 84/0147; H10D 30/0273; H10D 30/024; H10D 30/01; H10D 30/019; H10D 30/0191; H10D 30/0193; H10D 30/0194; H10D 30/0195; H10D 30/0196; H10D 30/0197; H10D 30/0198

See application file for complete search history.

(56) References Cited

U.S. PATENT DOCUMENTS

| | | | |
|---|---|---|---|
| 8,847,293 B2 | 9/2014 | Lee et al. | |
| 8,853,025 B2 | 10/2014 | Zhang et al. | |
| 8,962,400 B2 | 2/2015 | Tsai et al. | |
| 9,093,514 B2 | 7/2015 | Tsai et al. | |
| 9,166,010 B2 | 10/2015 | Kelly et al. | |
| 9,236,267 B2 | 1/2016 | De et al. | |
| 9,245,805 B2 | 1/2016 | Yeh et al. | |
| 9,287,382 B1 | 3/2016 | Lee et al. | |
| 9,520,482 B1 | 12/2016 | Chang et al. | |
| 9,548,362 B2 | 1/2017 | Ching et al. | |
| 9,576,814 B2 | 2/2017 | Wu et al. | |
| 9,640,533 B2 | 5/2017 | Lim et al. | |
| 9,899,268 B2 | 2/2018 | Wei et al. | |
| 10,026,662 B2 | 7/2018 | Sung et al. | |
| 10,483,266 B2 * | 11/2019 | Lee | H01L 21/31144 |
| 10,510,753 B2 | 12/2019 | Lee et al. | |
| 10,529,725 B2 * | 1/2020 | Lee | H01L 21/823418 |
| 10,985,167 B2 * | 4/2021 | Lee | H01L 21/823821 |
| 11,217,585 B2 * | 1/2022 | Lin | H01L 27/0207 |
| 11,581,226 B2 * | 2/2023 | Lin | H01L 21/823821 |
| 11,856,743 B2 * | 12/2023 | Lee | H01L 29/6656 |
| 2014/0065782 A1 | 3/2014 | Lu et al. | |
| 2014/0203338 A1 * | 7/2014 | Kelly | H10D 30/62 257/288 |
| 2016/0064387 A1 * | 3/2016 | Jeong | H10D 84/0193 257/401 |
| 2016/0190017 A1 | 6/2016 | Lee et al. | |
| 2016/0268171 A1 * | 9/2016 | Wei | H10D 86/011 |
| 2016/0358925 A1 | 12/2016 | Bai et al. | |
| 2017/0077222 A1 | 3/2017 | Lee et al. | |
| 2017/0133286 A1 * | 5/2017 | Sung | H01L 21/823821 |
| 2017/0207126 A1 * | 7/2017 | Ching | H01L 21/31111 |
| 2019/0157155 A1 | 5/2019 | Keng et al. | |

FOREIGN PATENT DOCUMENTS

| | | |
|---|---|---|
| CN | 106033757 A | 10/2016 |
| CN | 106560925 A | 4/2017 |
| CN | 106684149 A | 5/2017 |
| KR | 20160137962 A | 12/2016 |
| TW | 201409581 A | 3/2014 |
| TW | 201701464 A | 1/2017 |
| WO | 2015147842 A1 | 10/2015 |

\* cited by examiner

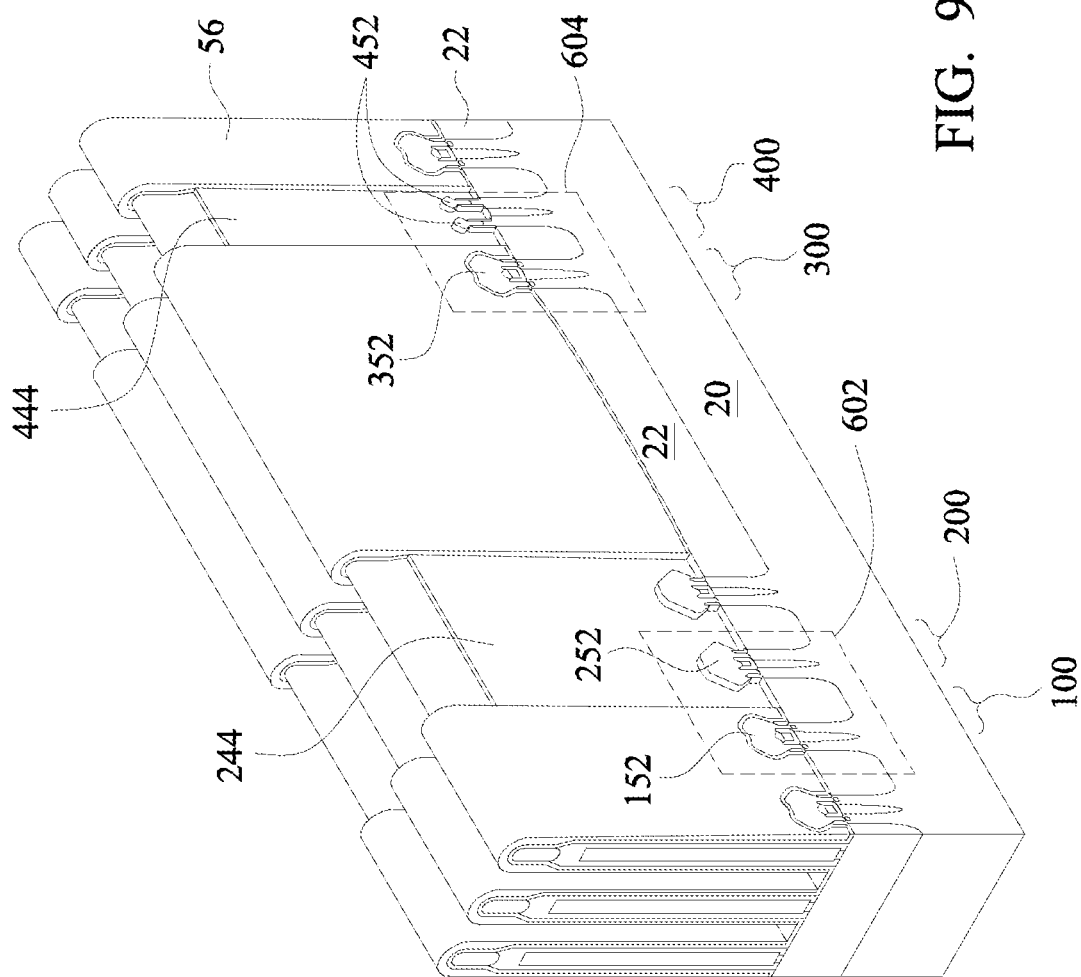

FLEXIBLE MERGE SCHEME FOR SOURCE/DRAIN EPITAXY REGIONS

PRIORITY CLAIM AND CROSS-REFERENCE

This application is a continuation of U.S. patent application Ser. No. 17/234,201, entitled "Flexible Merge Scheme for Source/Drain Epitaxy Regions," filed on Apr. 19, 2021, now U.S. Pat. No. 11,856,743, issued Dec. 26, 2023, which is a continuation of U.S. patent application Ser. No. 16/669,736, entitled "Flexible Merge Scheme for Source/Drain Epitaxy Regions," filed on Oct. 31, 2019, now U.S. Pat. No. 10,985,167, issued Apr. 20, 2021, which is a continuation of U.S. patent application Ser. No. 16/206,183, entitled "Flexible Merge Scheme for Source/Drain Epitaxy Regions," filed on Nov. 30, 2018, now U.S. Pat. No. 10,529,725 issued Jan. 7, 2020, which is a divisional of U.S. patent application Ser. No. 15/492,142, entitled "Flexible Merge Scheme for Source/Drain Epitaxy Regions," filed on Apr. 20, 2017, now U.S. Pat. No. 10,483,266 issued Nov. 19, 2019, which applications are incorporated herein by reference.

BACKGROUND

Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, three-dimensional transistors such as a Fin Field-Effect Transistors (FinFETs) have been introduced to replace planar transistors. Although existing FinFET devices and methods of fabricating FinFET devices have been generally adequate for their intended purposes, they have not been entirely satisfactory in all respects. For example, the FinFETs for different circuits such as core (logic) circuits and Static Random Access Memory (SRAM) circuits may have different designs, and the source/drain epitaxy regions grown from neighboring fins may need to be merged for some circuits (such as logic circuits), and need to be separated from each other for other circuits (such as SRAM circuits). However, to save manufacturing cost, the epitaxy for different regions is performed simultaneously. This causes difficulty for selectively making epitaxy regions merged for some circuits, and not merged for other circuits. Accordingly, the merged epitaxy regions need to be trimmed to separate the merged epitaxy regions from each other.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
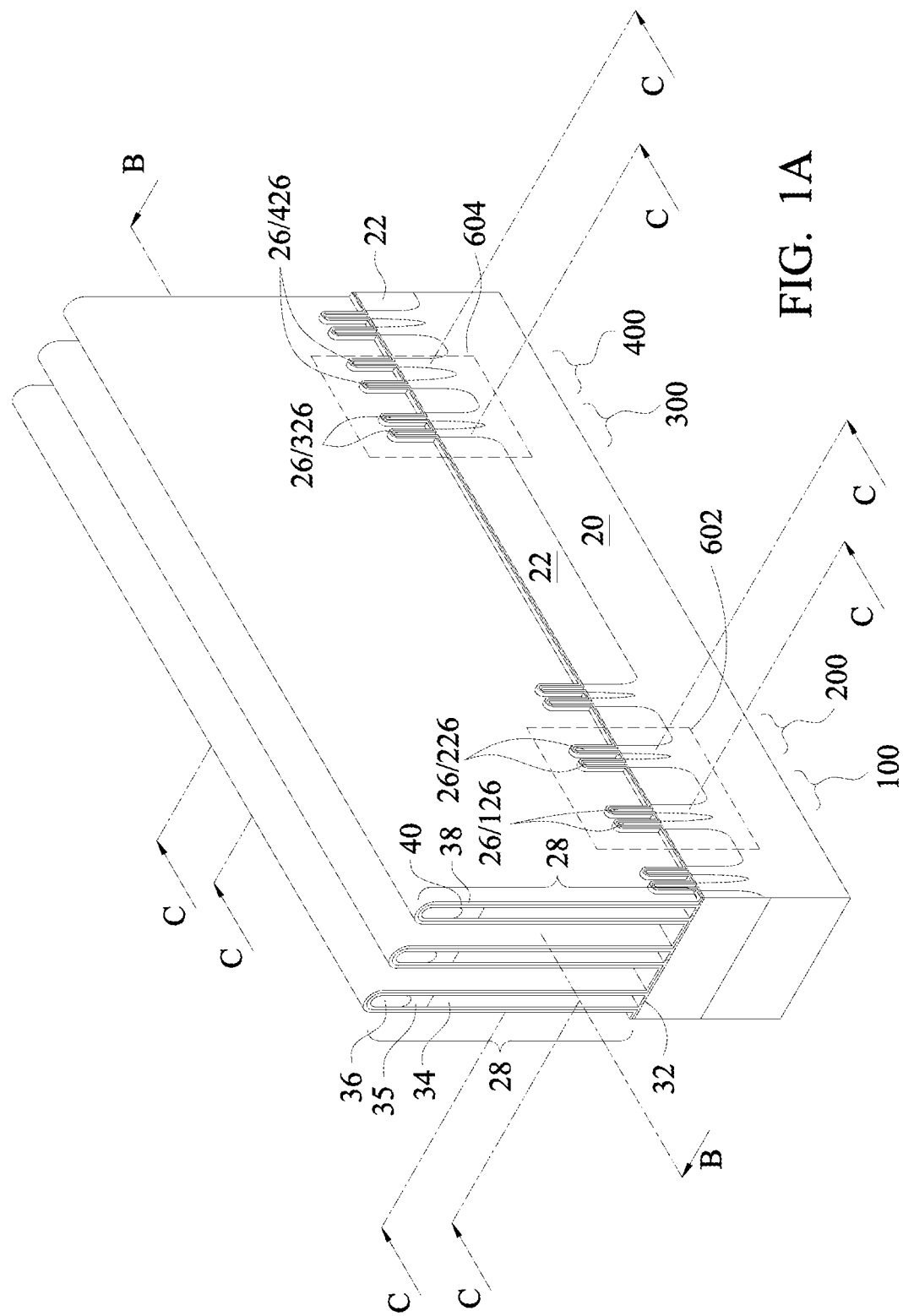
FIGS. 1A through 10C are cross-sectional views and perspective views of intermediate stages in the formation of Fin Field-Effect Transistors (FinFETs) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistor (FinFETs) and the method of forming the same are provided in accordance with various exemplary embodiments. The intermediate stages in the formation of the FinFETs are illustrated. The variations of some embodiments are discussed. Throughout the various views and illustrative embodiments, like reference numbers are used to designate like elements.

Figure 12:
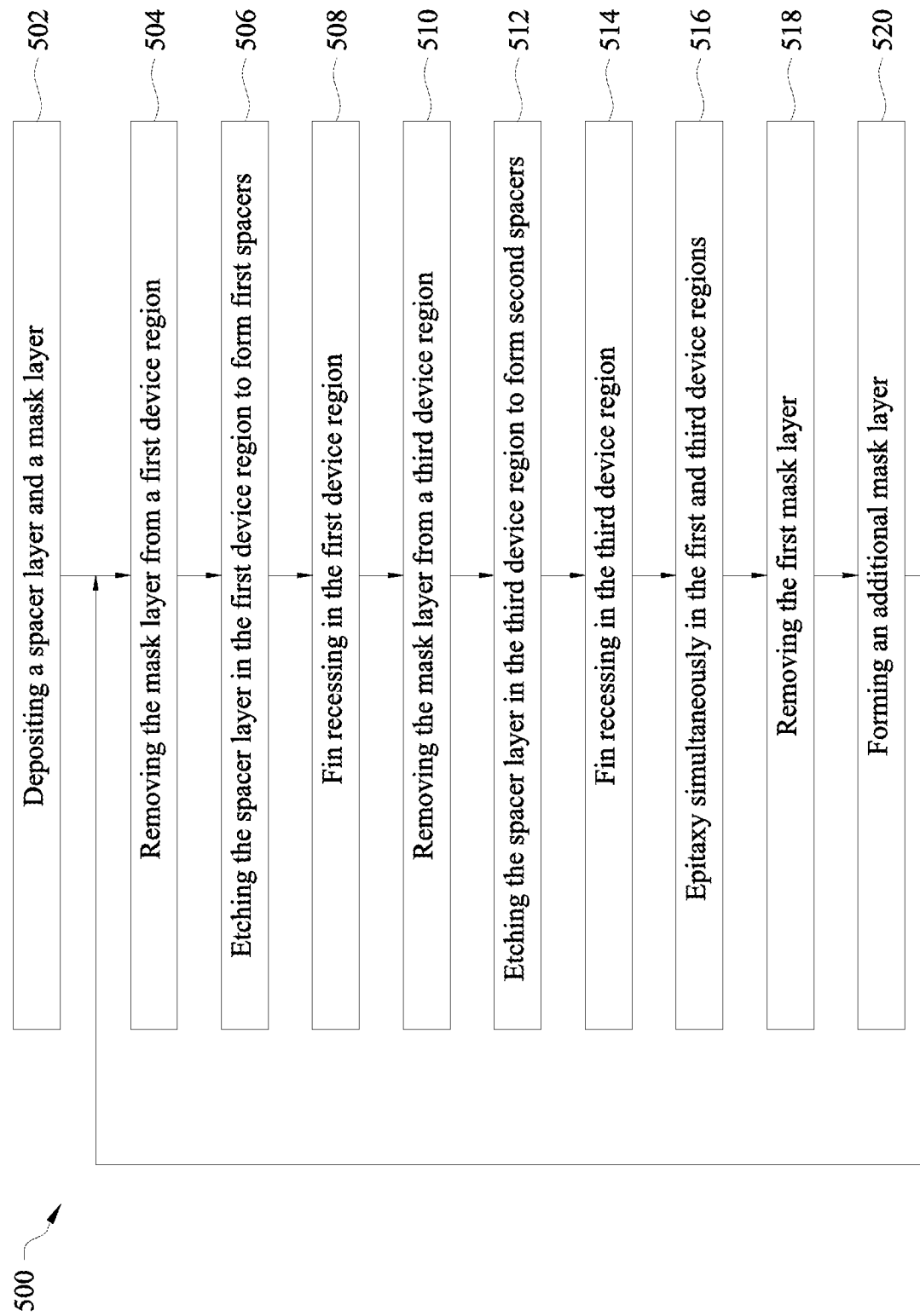
FIG. 12 illustrates a process flow for forming FinFETs in accordance with some embodiments.

FIGS. 1A through 10C illustrate the intermediate stages in the formation of FinFETs. The steps shown in FIGS. 1A through 10C are also illustrated schematically in the process flow 500 shown in FIG. 12. Each of the figure numbers in FIGS. 1A through 10C may include letter "A," "B," or "C," wherein letter "A" indicates that the respective figure illustrates a perspective view, and letter "B" indicates that the respective figure is obtained from the plane same as the vertical plane containing line B-B in FIG. 1A, and letter "C" indicates that the respective figure is obtained from (and combined) the planes same as the vertical planes containing lines C-C in FIG. 1A. Accordingly, the figures whose numbers include letter "B" show the cross-sectional views obtained from the vertical planes parallel to the lengthwise directions of gate stacks, and the figures whose numbers include letter "C" show the cross-sectional views obtained from the vertical planes parallel to the lengthwise directions of semiconductor fins, which will be discussed in detail in subsequent paragraphs.

FIG. 1A illustrates a perspective view in the formation of a structure including substrate 20, isolation regions 22, semiconductor strips 24 between isolation regions 22, and semiconductor fins 26 over the top surfaces of isolation regions 22. Substrate 20 is a semiconductor substrate, which may be a silicon substrate, a silicon carbon substrate, or a substrate formed of other semiconductor materials such as III-V compound semiconductor materials. Substrate 20 may be lightly doped with a p-type or an n-type impurity.

Isolation regions 22 may be, for example, Shallow Trench Isolation (STI) regions. The formation of STI regions 22 may include etching semiconductor substrate 20 to form trenches, and filling the trenches with a dielectric material(s) to form STI regions 22. STI regions 22 may include silicon oxide, and other dielectric materials such as nitrides may also be used. Semiconductor fins 26 overlap the underlying semiconductor strips 24. The formation of semiconductor fins 26 may include recessing STI regions 22, so that the portions of semiconductor material between the removed portions of STI regions 22 become semiconductor fins 26. Semiconductor fins 26 and some or substantially entireties of semiconductor strips 24 may be formed of silicon (with no germanium therein) or other silicon-containing compound including, and not limited to, silicon carbon, silicon germanium, or the like.

A plurality of parallel gate stacks 28 is formed on semiconductor fins 26. Gate stacks 28 are parallel to each other, and cover portions of semiconductor fins 26, while leaving some other portions of semiconductor fins 26 uncovered. Gate stacks 28 include gate dielectrics 32 on the sidewalls and the top surfaces of semiconductor fins 26, and gate electrodes 34 over gate dielectrics 32. Gate dielectrics 32 may be selected from silicon oxide, silicon nitride, gallium oxide, aluminum oxide, scandium oxide, zirconium oxide, lanthanum oxide, hafnium oxide, combinations thereof, and multi-layers thereof. Gate electrodes 34 may be formed of a conductive material that includes polysilicon, a refractory metal, or the respective compound including, e.g., polysilicon, Ti, W, TiAl, TaC, TaCN, TaAlC, TaAlCN, TiN, and TiW. In other examples, gate electrodes 34 include nickel (Ni), gold (Au), copper (Cu), or the alloys thereof.

In accordance with some embodiments of the present disclosure, gate stacks 28 remain in the final FinFETs, and form the gate stacks of the final FinFETs. In accordance with alternative embodiments of the present disclosure, gate stacks 28 are dummy gate stacks that will be replaced by replacement gates in subsequent steps. Accordingly, gate stacks 28 may include dummy gate electrodes (which is also denoted as 34), which may comprise polysilicon, for example. Dummy gate dielectrics 32 may, or may not, be formed between dummy gate electrodes 34 and semiconductor fins 26.

Gate stacks 28 may also include hard masks 35 and 36 formed over gate electrodes 34. In accordance with some embodiments, hard masks 35 are formed of silicon oxide, silicon oxycarbo-nitride (SiOCN), or the like. Hard masks 36 may be formed of silicon nitride (SiN), SiOCN, SiOC, or other dielectric materials in accordance with some embodiments.

The perspective view show in FIG. 1A illustrates the exemplary layouts of circuits 602 and 604 as schematically represented by dashed boxes. In accordance with some embodiments, each of circuits 602 and 604 is selected from logic circuits or SRAM circuits, and circuits 602 and 604 may be same types of circuits or different types of circuits. In the following discussion, circuits 602 and 604 are referred to as a logic circuit and an SRAM circuit, respectively as an example, while other combinations are also contemplated.

In accordance with some embodiments, circuit 602 is formed in a device region including n-type FinFET region wo and p-type FinFET region 200, and circuit 604 is formed in a device region including n-type FinFET region 300 and p-type FinFET region 400. Device regions 100, 200, 300, and 400 are also illustrated in FIGS. 1B and 1C through 10C. Semiconductor fins 126, 226, 326, and 426 are formed in regions 100, 200, 300, and 400, respectively, and are referred to collectively as semiconductor fins 26. Gate stacks 28 are formed in the directions perpendicular to the lengthwise directions of semiconductor fins 26. It is noted that although the gate stacks 28 are illustrated as continuously extending into different device regions 100, 200, 300, and 400 for a compact illustration purpose, the gate stacks 28 in different device regions may be physically separated from each other, or some gate stacks 28 in some of device regions may be connected in any combination, while the gate stacks 28 in other device regions are separated.

Figure 1B:
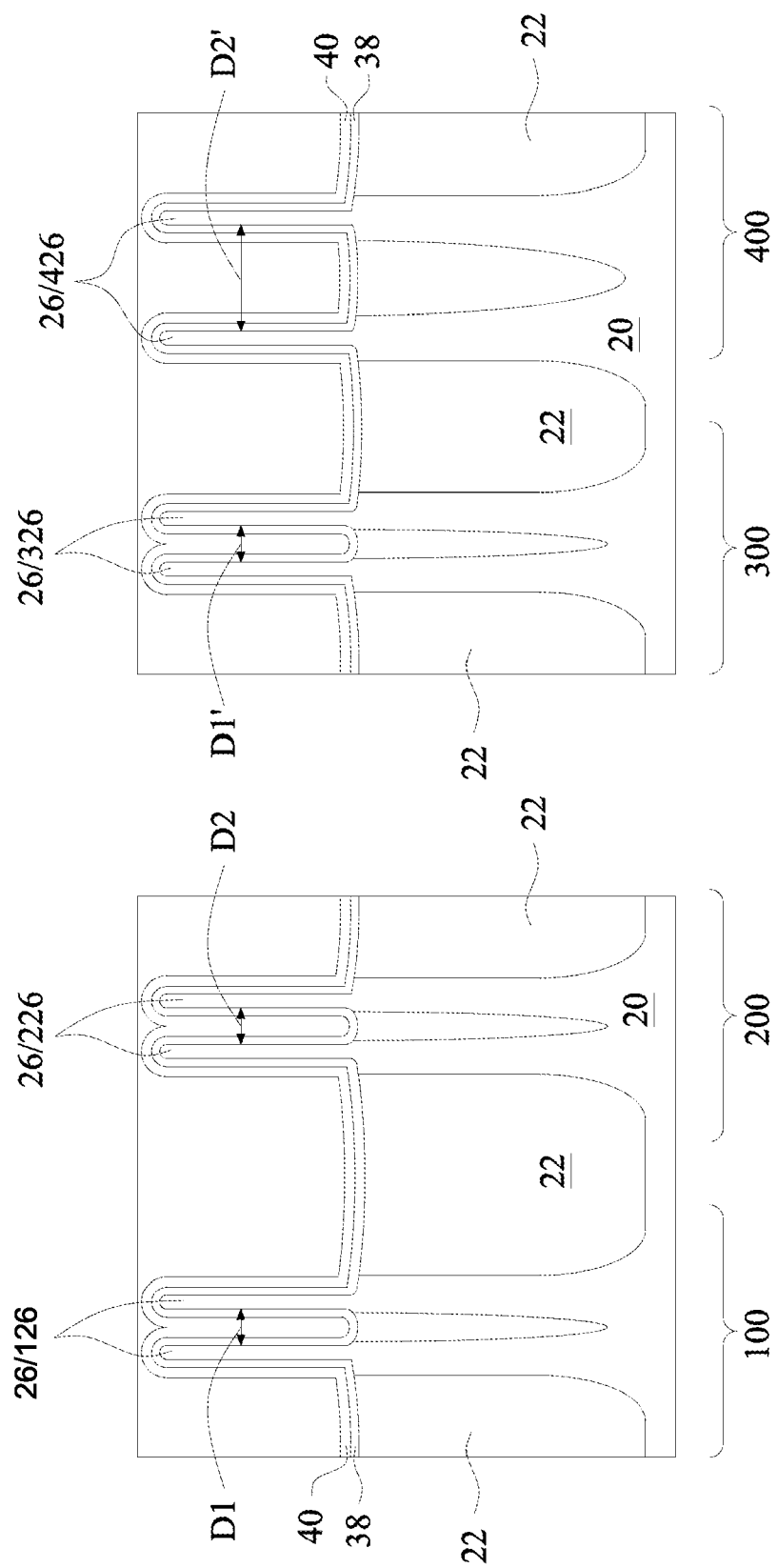
Figure 1C:
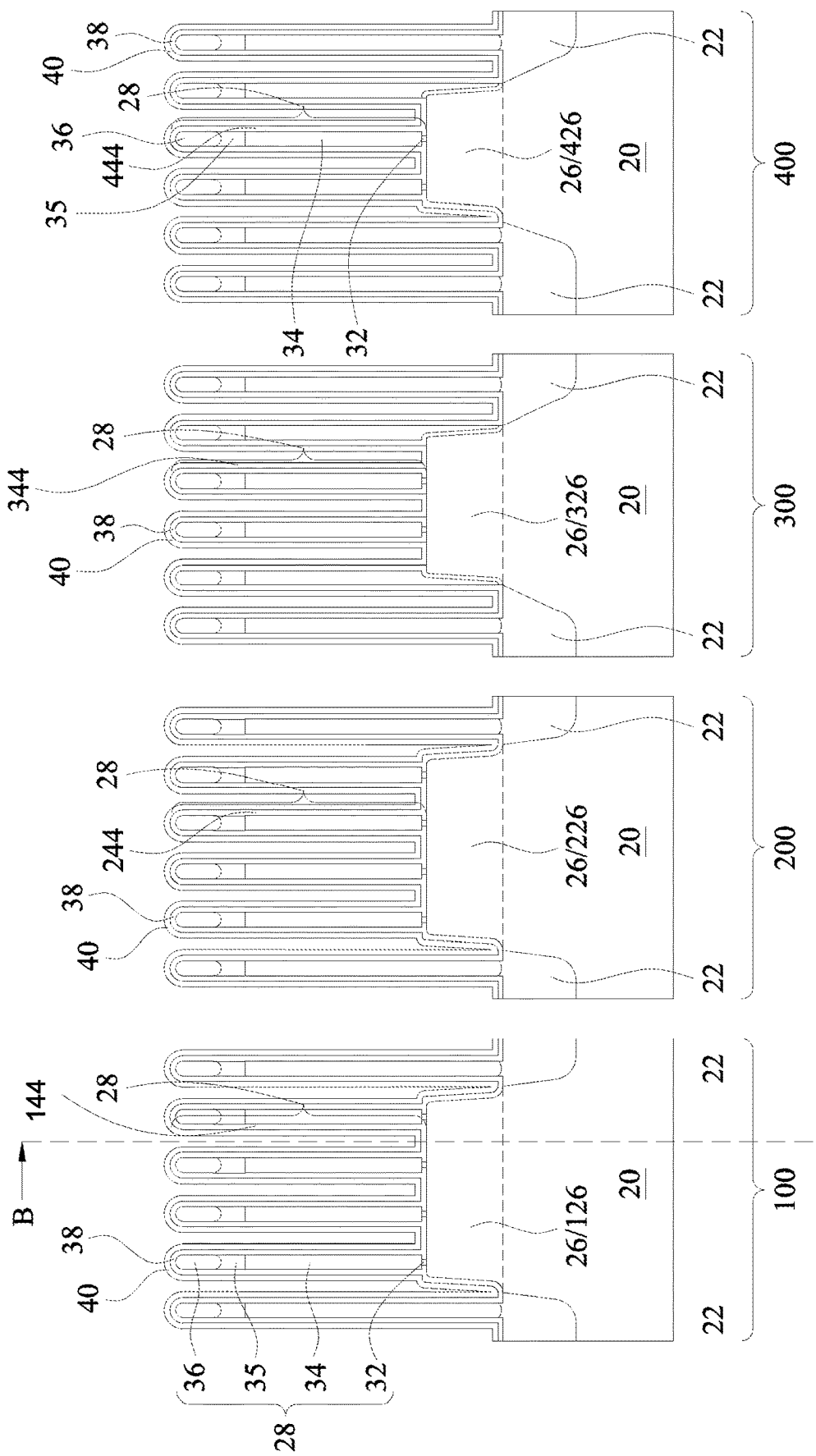

FIG. 1B illustrates the cross-sectional views of semiconductor fins 26 in device regions 100, 200, 300, and 400, wherein the cross-sectional view is obtained from the plane crossing line B-B in FIG. 1A. Also, the plane of cross-sectional view is obtained from the middle of two neighboring gate stacks 28 (as schematically illustrated in FIG. 1C). As shown in FIG. 1B, distance D1 between neighboring fins 126 may be greater than, equal to, or smaller than, distance D1' between neighboring fins 326. Distance D2 between neighboring fins 226 may be greater than, equal to, or smaller than, distance D2' between neighboring fins 426. The illustrated view in FIG. 1B reflects the structures shown in the regions marked by dashed lines 602 and 604 in FIG. 1A (also refer to Figure ii).

FIG. 1C illustrates the cross-sectional views of device regions 100, 200, 300, and 400, wherein the cross-sectional views are obtained from the planes crossing lines C-C in FIG. 1A.

As shown in FIGS. 1A, 1B, and 1C, dielectric layer 38 is formed. The respective step is illustrated as step 502 in the process flow shown in FIG. 12. Dielectric layer 38 is alternatively referred to as a spacer layer. In accordance with some embodiments of the present disclosure, spacer layer 38 is formed of silicon nitride, silicon oxide, silicon carbo-nitride (SiCN), silicon oxy-carbo-nitride (SiOCN), silicon oxynitride (SiON), while other dielectric materials may be used. Spacer layer 38 may have a thickness in the range between about 2 nm and about 5 nm.

Spacer layer 38 is formed as a conformal layer, and hence covers the top surfaces and the sidewalls of semiconductor fins 26 (FIG. 1B) and gate stacks 28 (FIG. 1C). The portions of spacer layer 38 on the sidewalls of semiconductor fins 26 are used to form fin spacers, as shown in FIG. 2B, and the portions of spacer layer 38 on the sidewalls of semiconductor fins 26 are used to form gate spacers.

Mask layer 40 is formed over spacer layer 38. The respective step is also illustrated as step 502 in the process flow shown in FIG. 12. The material of mask layer 4o is selected to have a high etching selectivity with relative to the material of spacer layer 38. In accordance with some embodiments of the present disclosure, the material of mask layer 4o is also selected from silicon nitride, silicon oxide, silicon carbo-nitride (SiCN), silicon oxy-carbo-nitride (SiOCN), and silicon oxynitride (SiON). Mask layer 4o may have a thickness in the range between about 2 nm and about 10 nm. Mask layer 4o is also formed as a conformal layer. The formation of spacer layer 38 and mask layer 4o may be selected from conformal deposition methods such as Atomic Layer Deposition (ALD) and Chemical Vapor Deposition (CVD). Both spacer layer 38 and mask layer 40 extend into device regions 100, 200, 300, and 400.

Figure 2A:
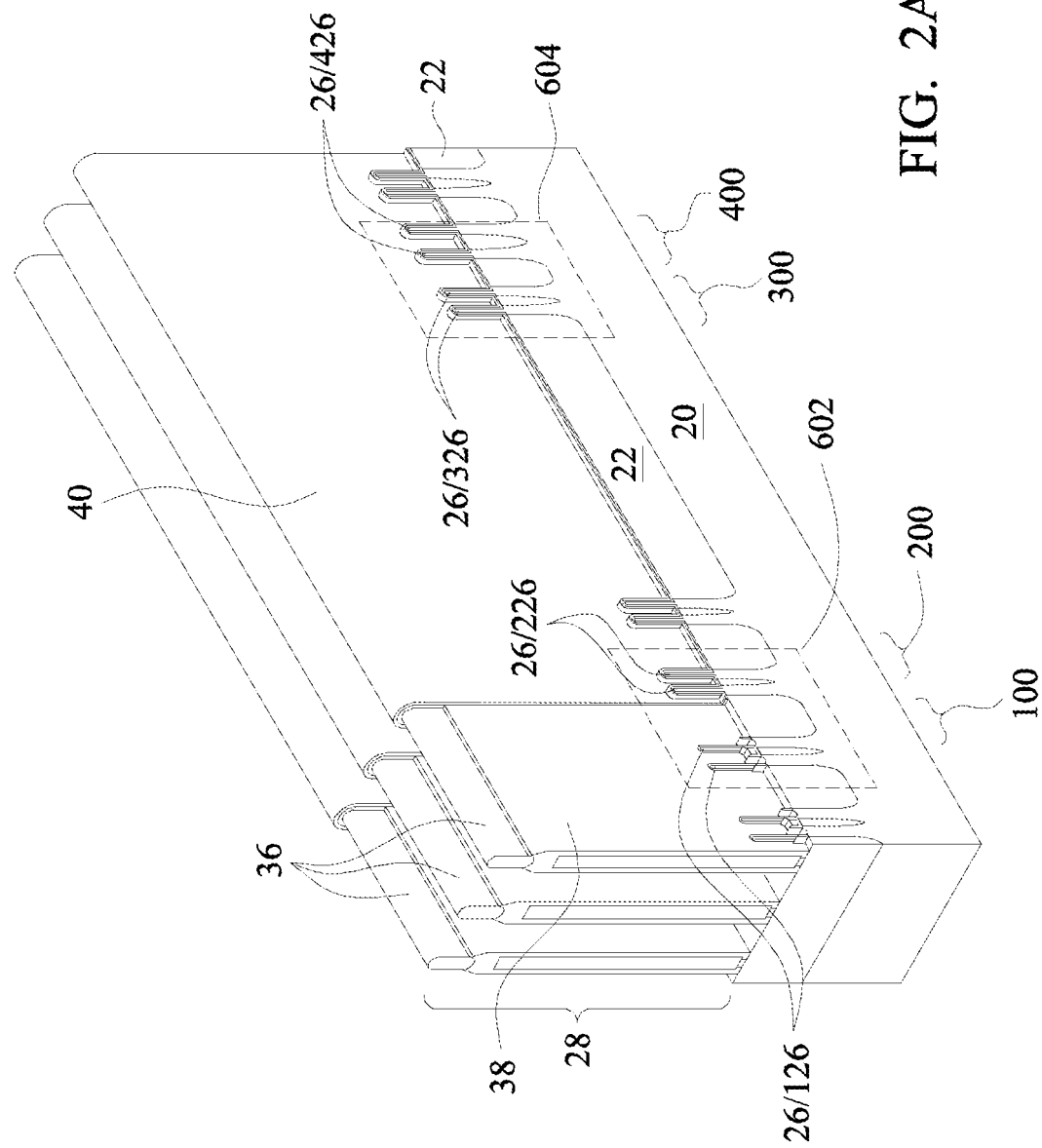
Figure 2B:
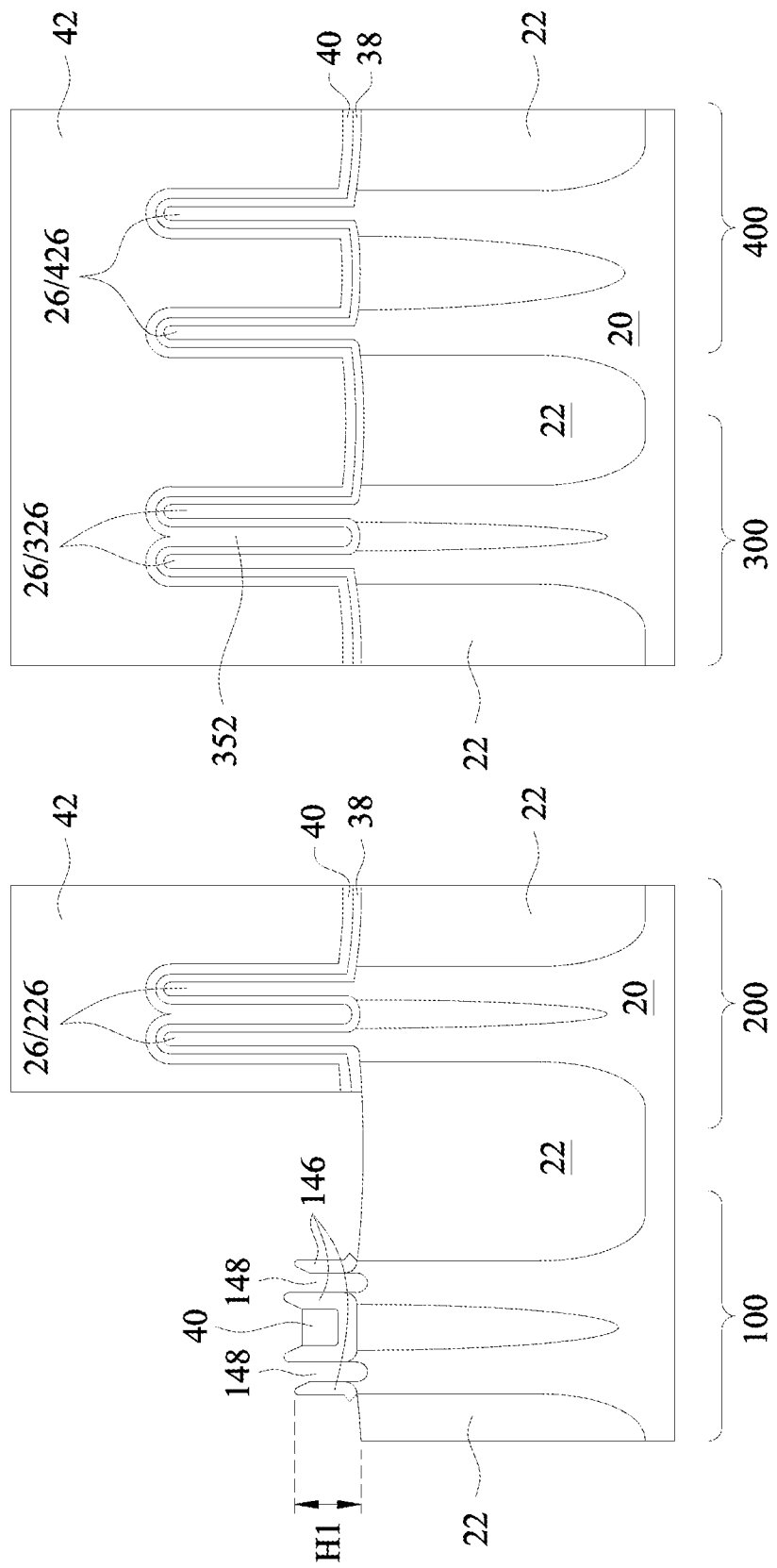
Figure 2C:
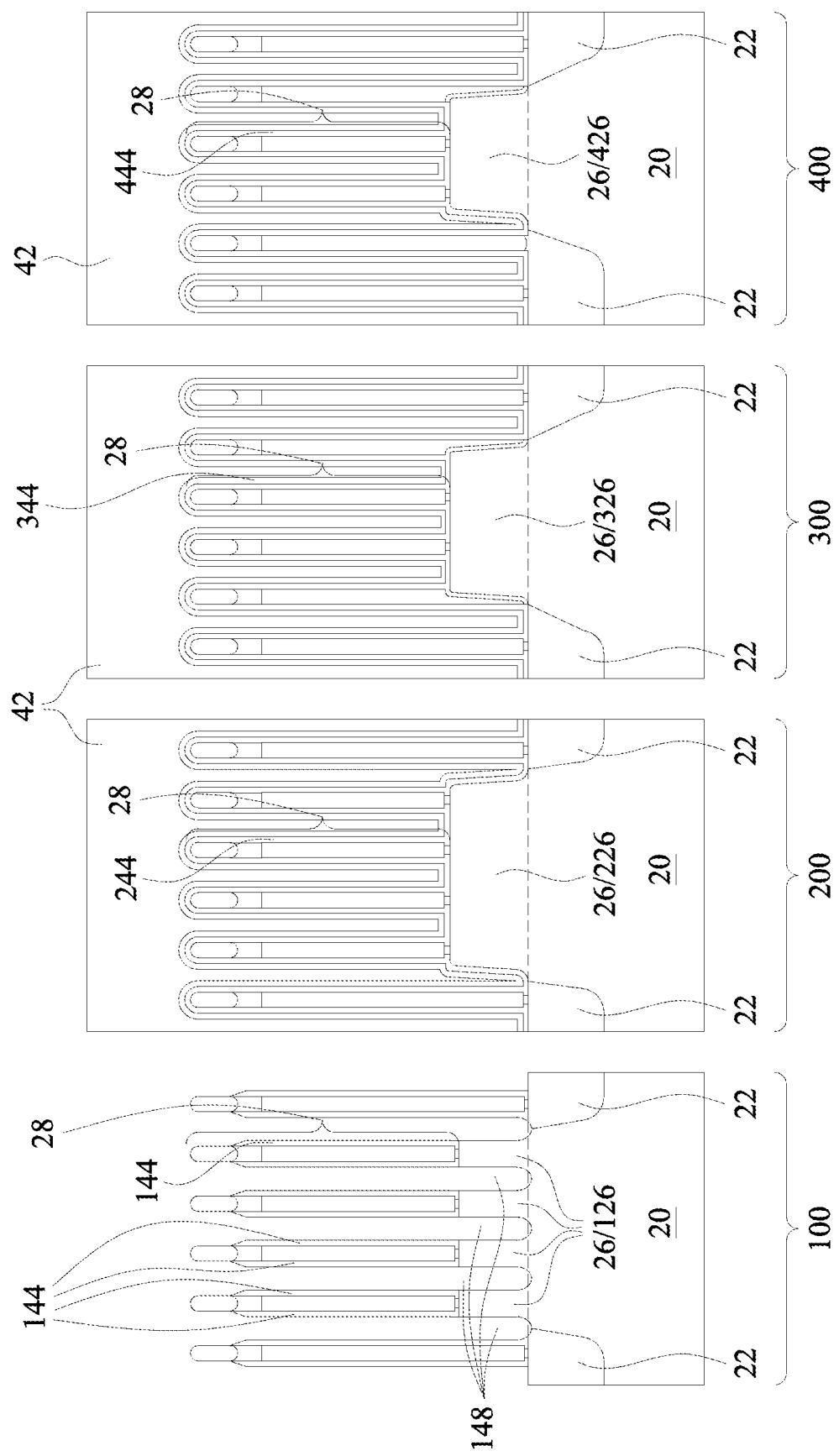

FIGS. 2A, 2B, and 2C illustrate the patterning of spacer layer 38 in region 100. First, photo resist 42 is applied and patterned, wherein the photo resist 42 is illustrated in FIGS. 2B and 2C, and not in FIGS. 2A, although it still exists in FIG. 2A. Photo resist 42 may be a single-layer photo resist, or a tri-layer photo resist including an inorganic layer (known as middle layer) sandwiched between two photo resists (known as under layer and upper layer).

The patterned photo resist 42 covers regions 200, 300, and 400, and leaves region 100 uncovered. Next, an etching step is performed to remove the portions of mask layer 40 from region 100. The respective step is illustrated as step 504 in the process flow shown in FIG. 12. Depending on the process and the distance between neighboring fins 126 (FIG. 1C), mask layer 40 may or may not have a residue portion left between neighboring fins 126, as shown in FIG. 2B. After mask layer 40 is removed, the portion of spacer layer 38 in region 100 is exposed, and an anisotropic etching is performed to etch spacer layer 38 in region 100, so that the top portions of spacer layer 38 on top of fins 126 are removed, exposing fins 126. The respective step is illustrated as step 506 in the process flow shown in FIG. 12. The remaining portions of spacer layer 38 on the sidewalls of gate stacks 28 become gate spacers 144 (FIG. 2C), and the remaining portions of spacer layer 38 on the sidewalls of fins 126 (FIG. 1B) become fin spacers 146 (FIG. 2B). The etching time of spacer layer 38 is selected so that fin spacers 146 have appropriate height H1 (FIG. 2B).

In a subsequent step, the exposed semiconductor fins 126 are recessed, for example, in an anisotropic or isotropic etching step, so that recesses 148 (FIGS. 2B and 2C) are formed to extend into semiconductor fins 126. The respective step is illustrated as step 5o8 in the process flow shown in FIG. 12. The bottoms of recesses 148 may be higher than, level with, or lower than the top surfaces of STI regions 22. The etching is performed using an etchant that attacks fins 126, and hardly attacks fin spacers 146. Accordingly, in the etching step, the height of fin spacers 146 is substantially not reduced. After the formation of recesses 148, photo resist 42 is removed, for example, in an ashing step.

Figure 3A:
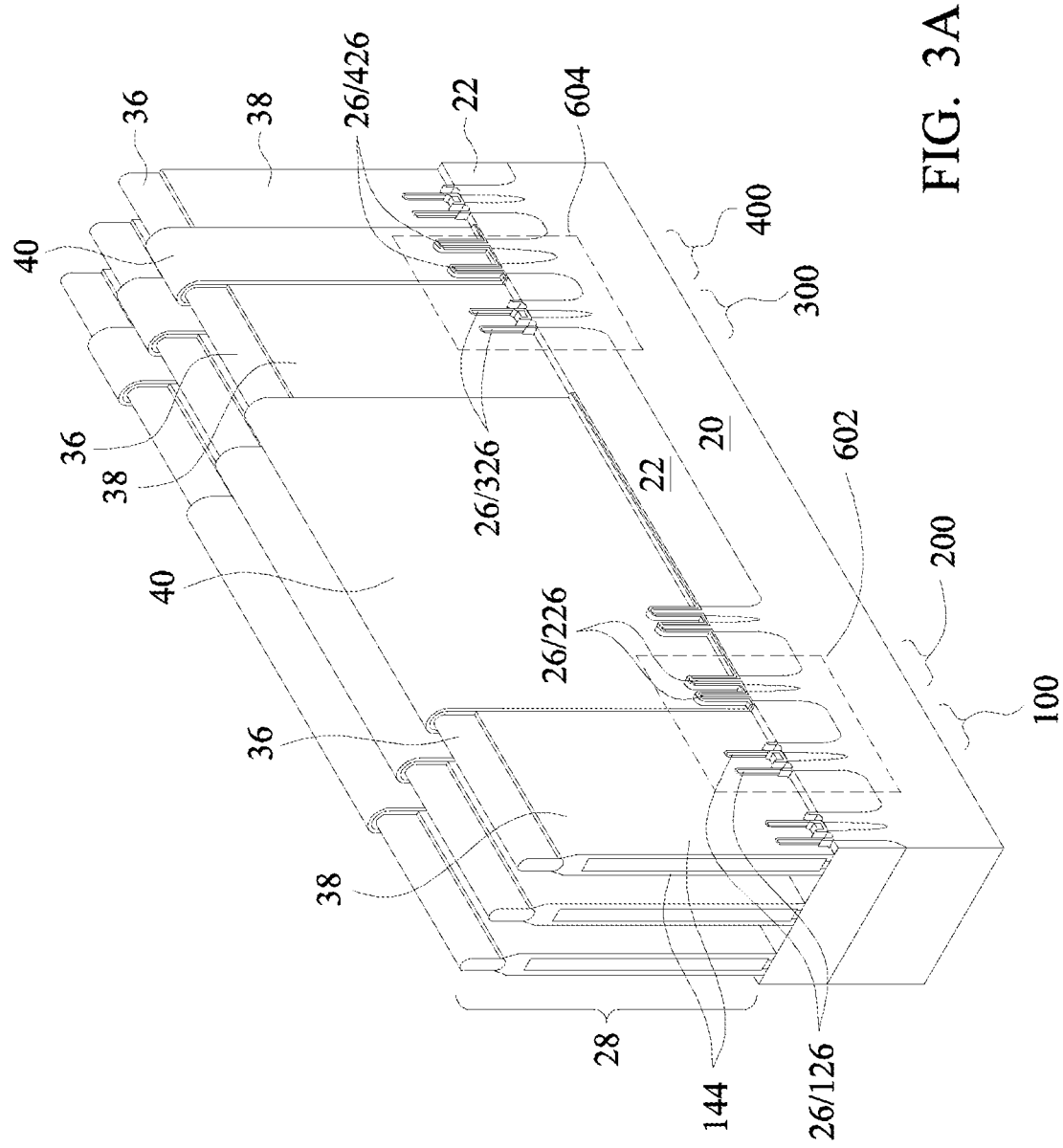
Figure 3B:
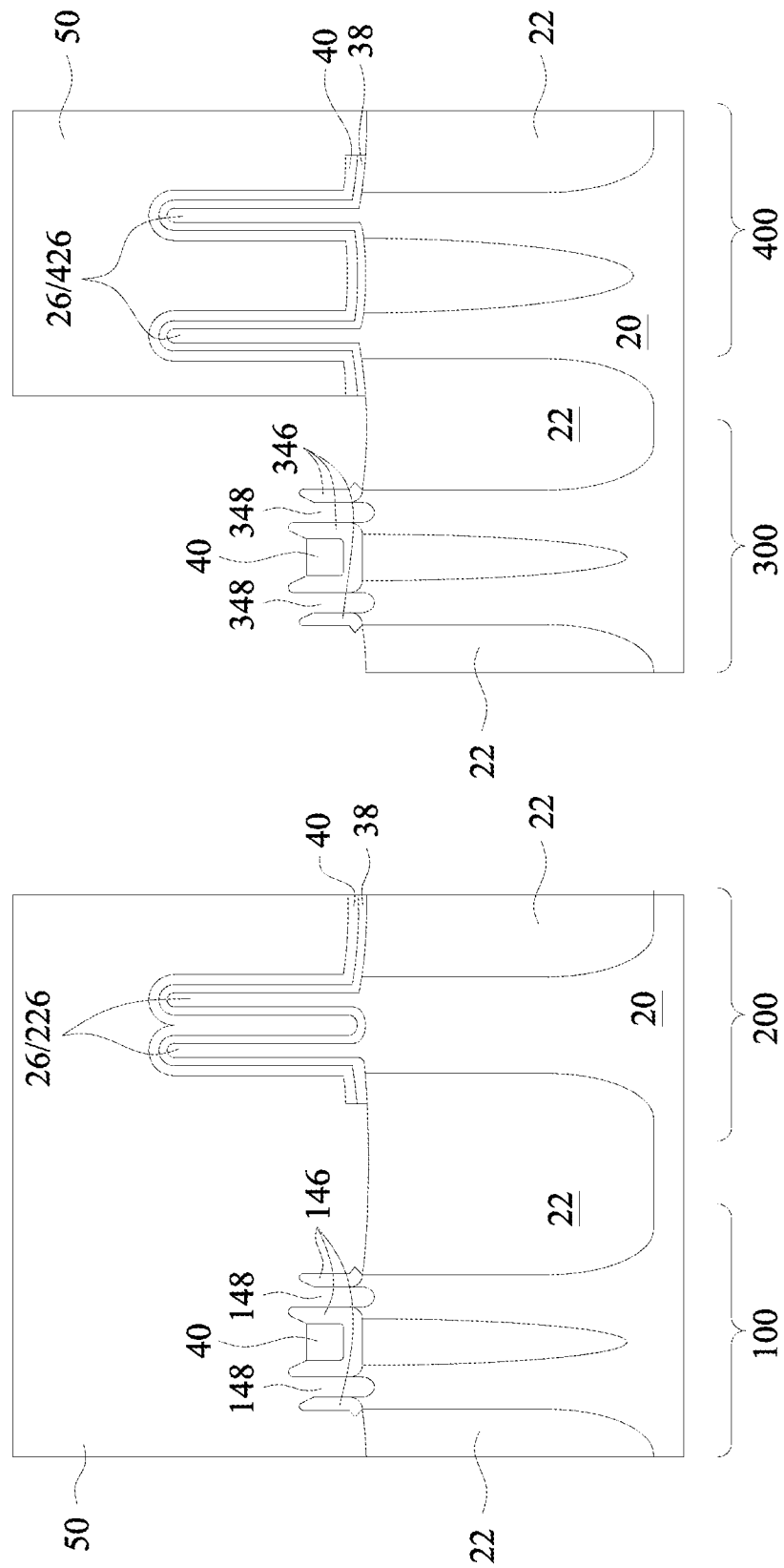
Figure 3C:
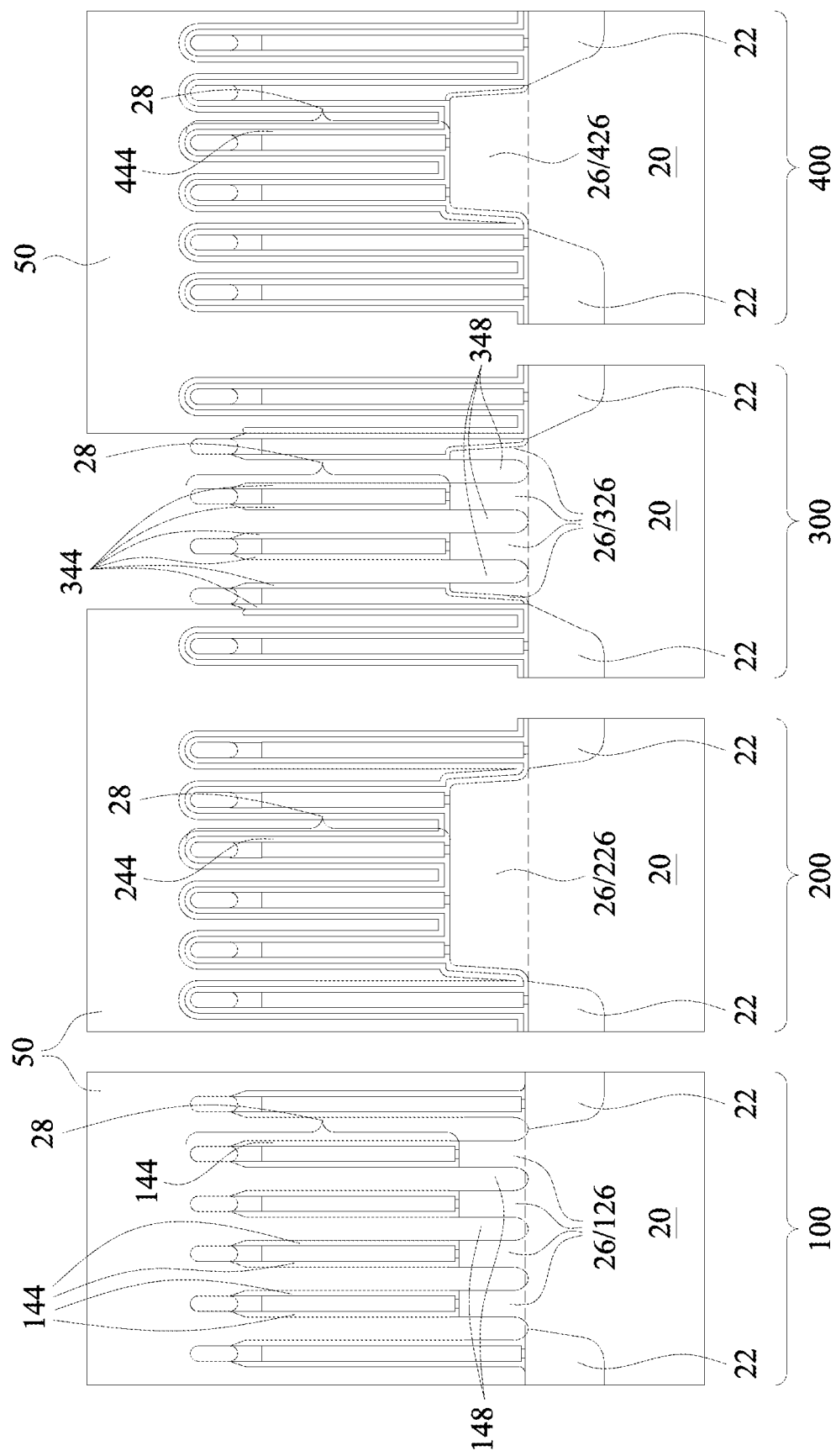

FIGS. 3A, 3B, and 3C illustrate the patterning of spacer layer 38 in region 300. First, photo resist 50 is applied and patterned, wherein the photo resist 50 is illustrated in FIGS. 3B and 3C, and not in FIGS. 3A, although it still exists in FIG. 3A. Photo resist 50 may also be a single-layer photo resist or a tri-layer photo resist. The patterned photo resist 50 covers regions 100, 200, and 400, and leaves region 300 uncovered. Next, an etching step is performed to remove the portions of mask layer 40 in region 300. The respective step is illustrated as step 510 in the process flow shown in FIG. 12. Depending on the process and the distance between neighboring fins 326 (FIG. 2C), mask layer 40 may, or may not have a residue portion left between neighboring fins 326 (FIG. 3C). After mask layer 40 is removed, the portion of spacer layer 38 in region 300 is exposed, and an anisotropic etching is performed to etch spacer layer 38, so that the top portions of spacer layer 38 on top of fins 326 are removed, exposing fins 326. The respective step is illustrated as step 512 in the process flow shown in FIG. 12. The remaining portions of spacer layer 38 on the sidewalls of gate stacks 28 become gate spacers 344 (FIG. 3C), and the remaining portions of spacer layer 38 on the sidewalls of fins 326 (FIG. 3B) become fin spacers 346 (FIG. 3B). The etching time of spacer layer 38 is selected so that fin spacers 346 will have appropriate height H3 (FIG. 3B).

In a subsequent step, the exposed semiconductor fins 326 are recessed, for example, in an anisotropic or isotropic etching step, so that recesses 348 (FIGS. 3B and 3C) are formed to extend into semiconductor fins 326. The respective step is illustrated as step 514 in the process flow shown in FIG. 12. The bottoms of recesses 348 may be higher than, level with or lower than the top surfaces of STI regions 22. The etching is performed using an etchant that attacks fins 326, and hardly attacks fin spacers 346. Accordingly, in the etching step, the height of fin spacers 346 is substantially not reduced. After the formation of recesses 348, photo resist 50 is removed.

Figure 4A:
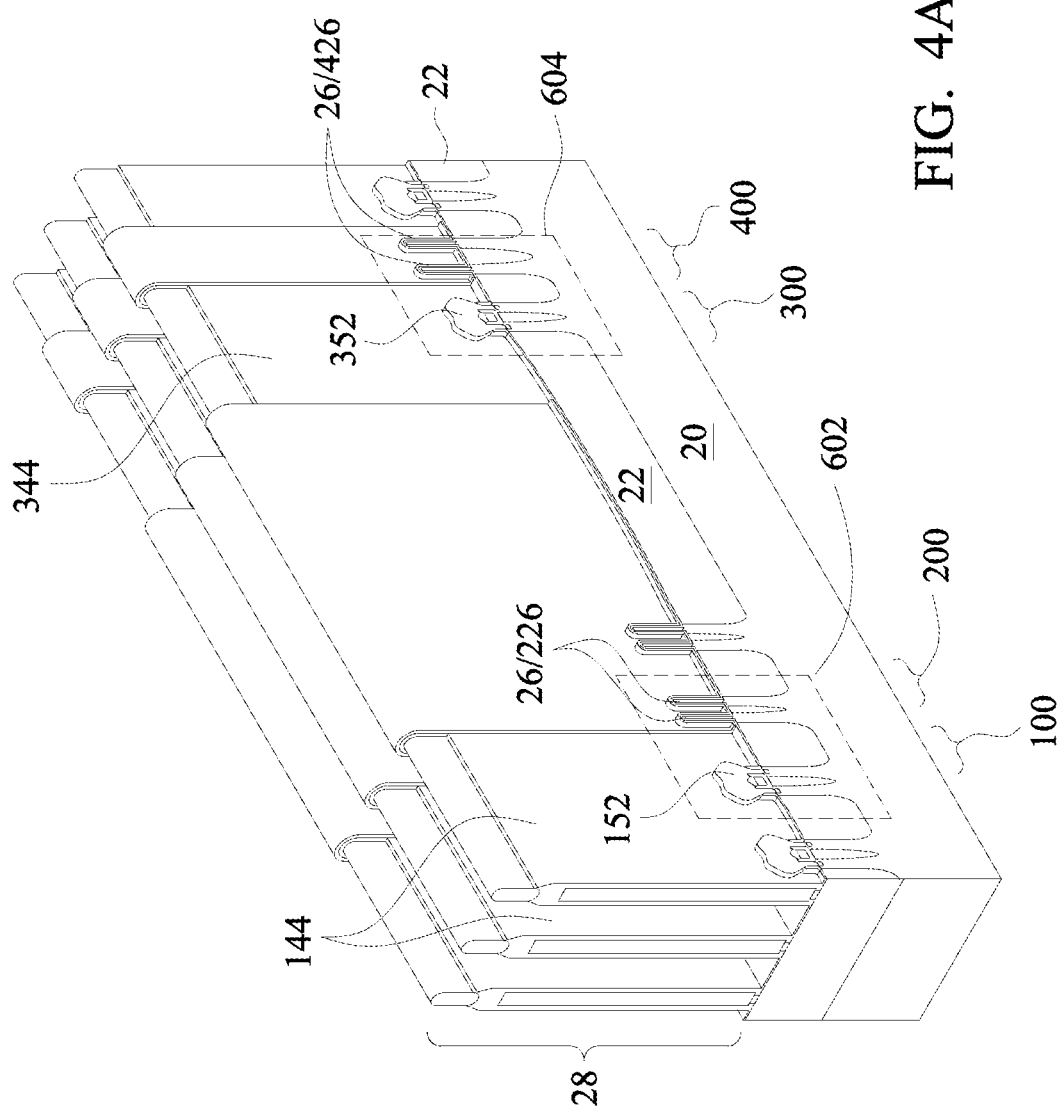
Figure 4B:
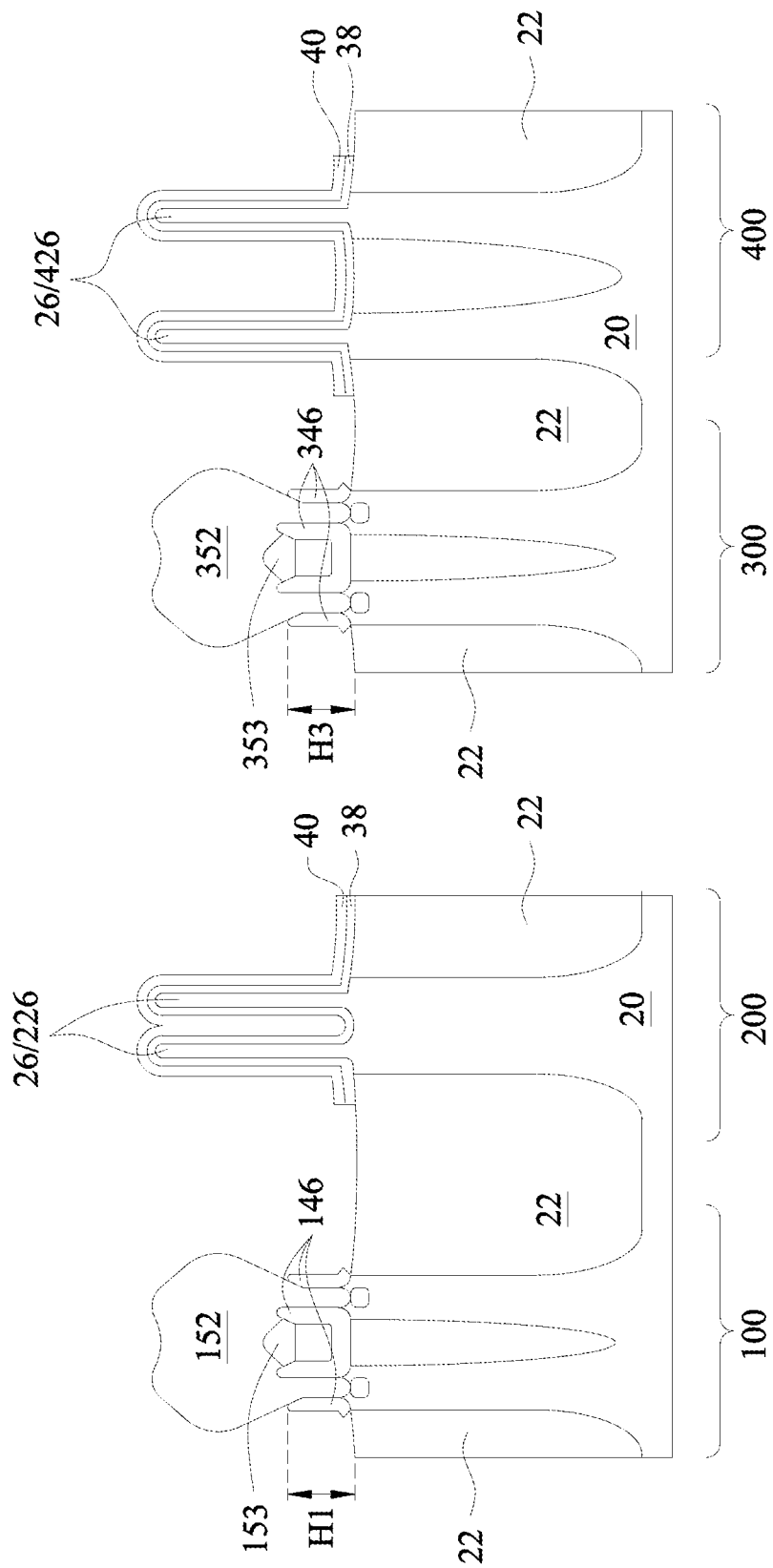
Figure 4C:
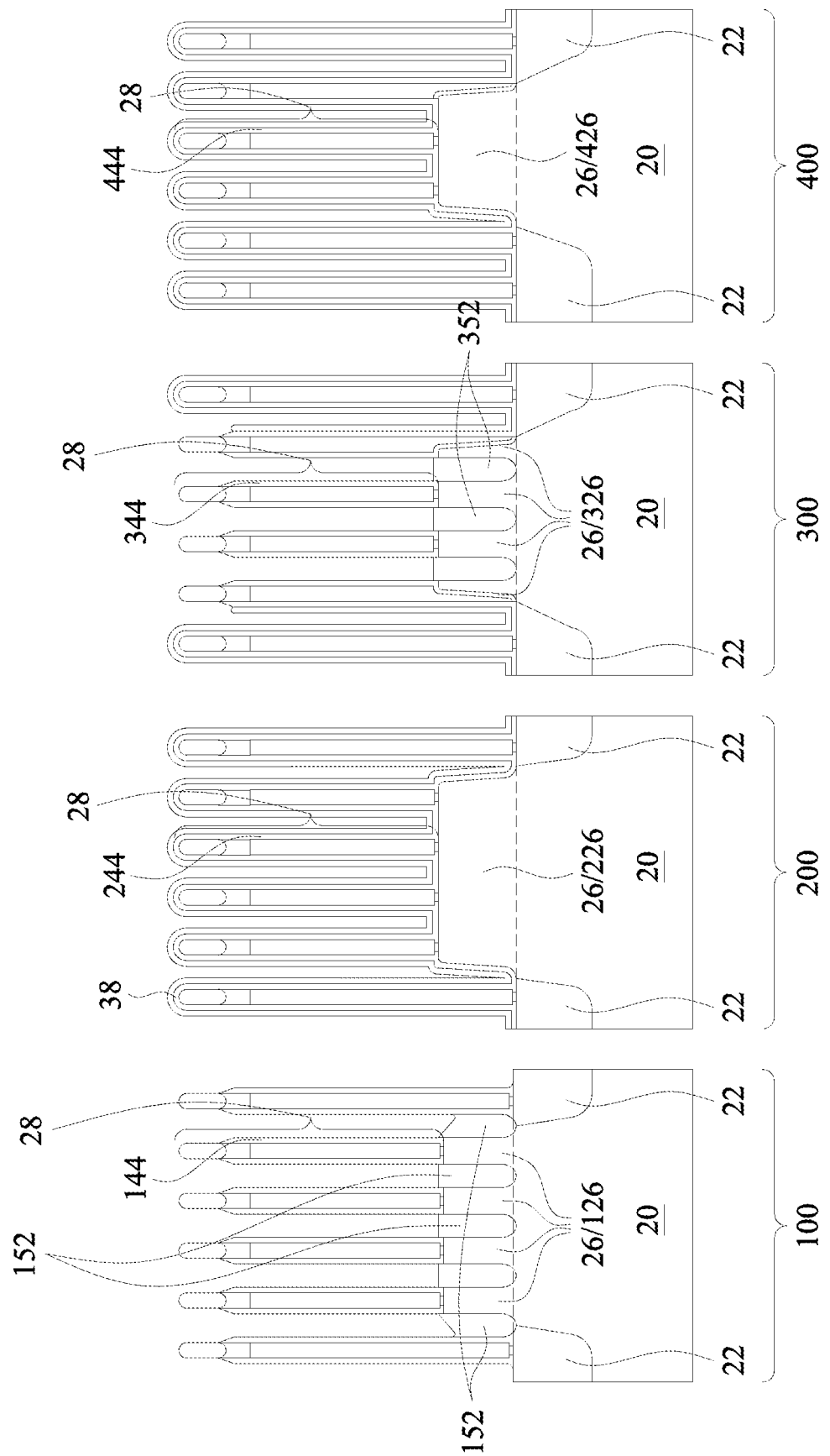

FIGS. 4A, 4B, and 4C illustrate the simultaneously epitaxy for forming epitaxy semiconductor regions 152 and 352 (which are source/drain regions of FinFETs) in regions 100 and 300, respectively. The respective step is illustrated as step 516 in the process flow shown in FIG. 12. In accordance with some embodiments of the present disclosure, the formation of epitaxy regions 152 and 352 includes epitaxially growing silicon phosphorous (SiP) or phosphorous-doped silicon carbon (SiCP), and the resulting FinFETs formed in regions 100 and 300 are n-type FinFETs. As shown in FIG. 4B, in the initial stage of the epitaxy, the grown epitaxy regions 152 and 352 are confined by fin spacers 146 and 346. After the epitaxy regions 152 and 352 are grown to higher than the top ends of epitaxy regions 152 and 352, respectively, lateral growth also occurs along with the vertical growth, and epitaxy regions 152 and 352 expand laterally.

Figure 4D:
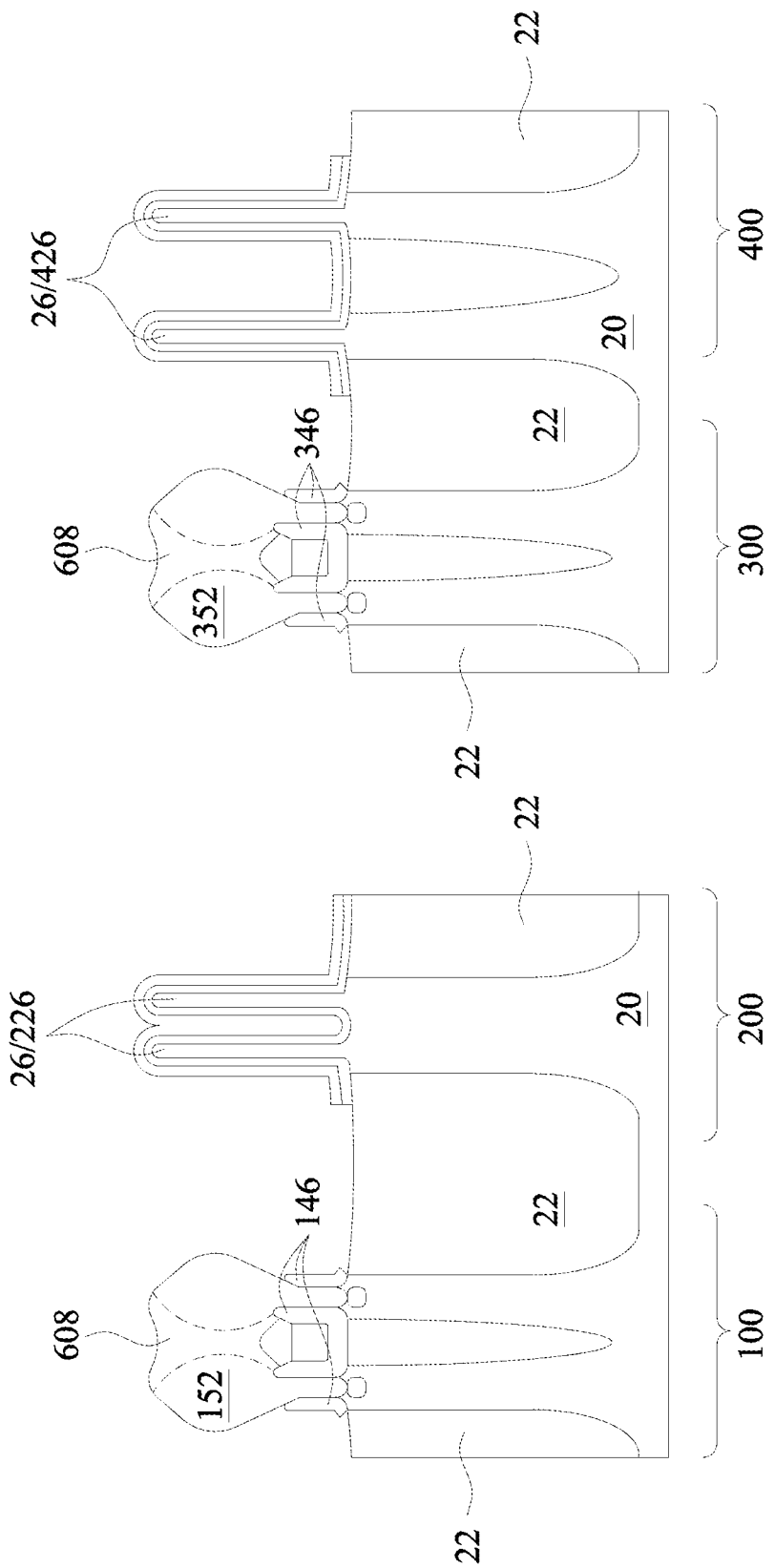

The portions of epitaxy regions 152 grown from neighboring recesses 148 may be merged as a large epitaxy region, or remain separated from each other when the epitaxy if finished. The portions of epitaxy regions 352 grown from neighboring recesses 348 may also be merged into a large epitaxy region, or remain separated from each other when the epitaxy if finished. In addition, voids 153 and 353 may be formed when mergence occurs. Whether the mergence occurs or not depends on the heights of the respective fin spacers 146 and 346, and how long the epitaxy lasts. Accordingly, by adjusting heights H1 and H3 (FIG. 4B), one of the following four scenarios may occur: the mergence occurs for both epitaxy regions 152 and 352, the mergence occurs for epitaxy regions 152 but not for epitaxy regions 352, the mergence occurs for epitaxy regions 352 but not for epitaxy regions 152, and the mergence doesn't occur for either of epitaxy regions 152 and 352. FIG. 4D illustrates some exemplary embodiments, wherein the un-merged epitaxy regions 152 and 352 are illustrated if the corresponding epitaxy portions 608 in dashed lines don't exist.

Referring back to FIG. 4B, if, for example, it is desirable that the mergence occur for epitaxy regions 152 but not for epitaxy regions 352, fin spacers 146 may be formed to have height H1 smaller than height H3 of fin spacers 346. As a result, the lateral expansion occurs earlier for epitaxy regions 152 than epitaxy regions 352, and epitaxy regions 152 merge while epitaxy regions 352 don't merge. In accordance with some embodiments of the present disclosure, to make height H1 smaller than height H3, the period of time TP1 for etching spacer layer 38 (the step shown in FIG. 2B) may be selected to be longer than the period of time TP3 for etching spacer layer 38 (the step shown in FIG. 3B). In accordance with some embodiments of the present disclosure, ratio TP1/TP3 may be greater than about 1.5, and may be in the range between about 1.5 and about 5.0. As a result, height H3/H1 may be greater than about 1.5, and may be in the range between about 1.5 and about 5.0. With the merging of neighboring epitaxy regions, the resulting Fin-FET may have a higher drive (saturation current). With the neighboring epitaxy regions not merged, the resulting Fin-FETs may be more compact. Accordingly, different requirements of different circuits may be met at the same time without requiring the epitaxy regions to be formed by different epitaxy processes.

Converse to the above discussion, if it is desirable that the mergence occur for epitaxy regions 352 but not form epitaxy regions 152, fin spacers 146 may be formed to have height H1 greater than height H3 of fin spacers 346. In accordance with some embodiments of the present disclosure, ratio TP3/TP1 may be greater than about 1.5, and may be in the range between about 1.5 and about 5.0. Also, height H1/H3 may be greater than about 1.5, and may be in the range between about 1.5 and about 5.0.

In accordance with some embodiments, after the epitaxy, an implantation is performed to implant an n-type impurity such as phosphorous or arsenic into epitaxy regions 152 and 352 to form source/drain regions, which are also referred to using reference numerals 152 and 352. In accordance with alternative embodiments, no implantation of any n-type impurity is performed, and the n-type impurity was provided through the in-situ doping occurred during the epitaxy.

Figure 5A:
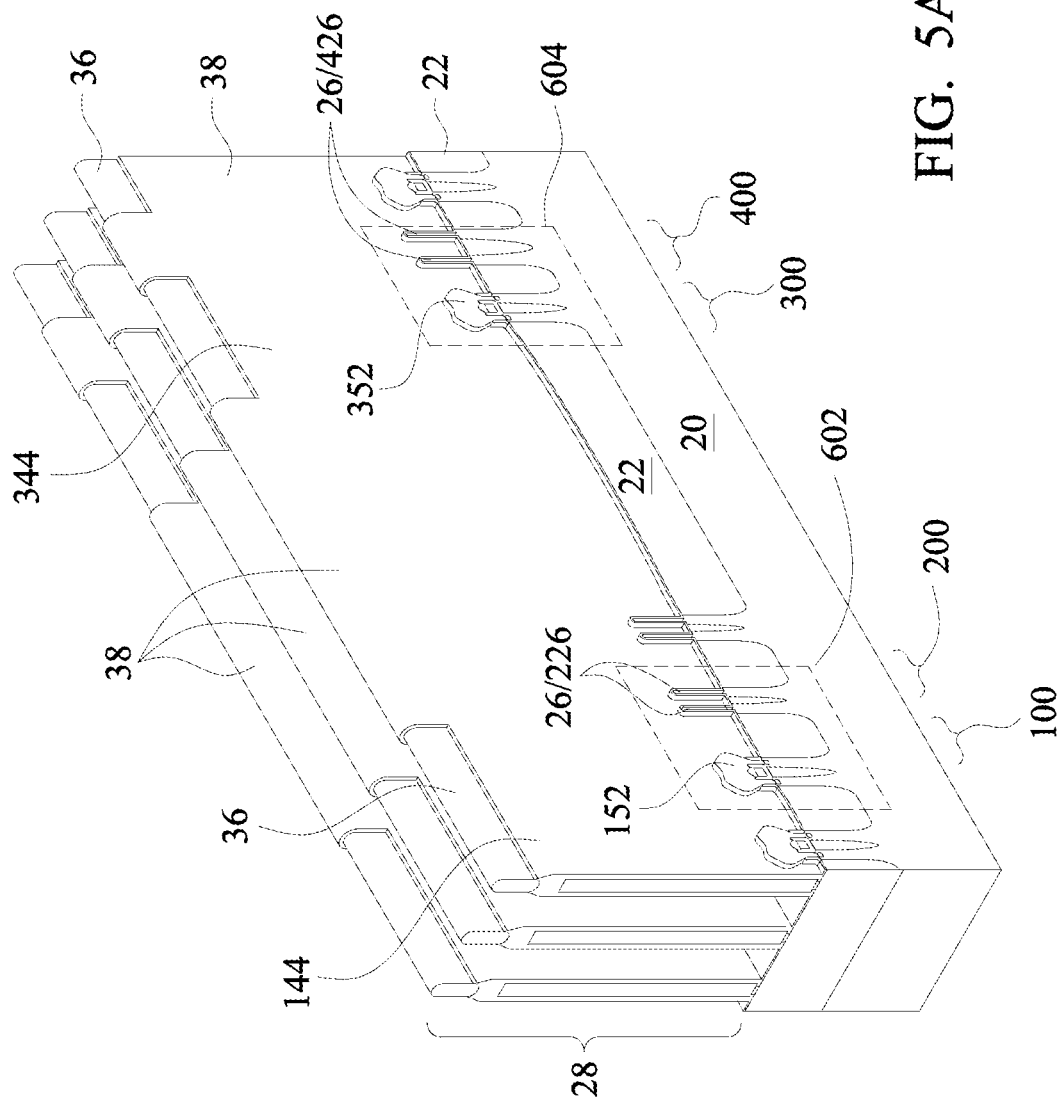
Figure 5B:
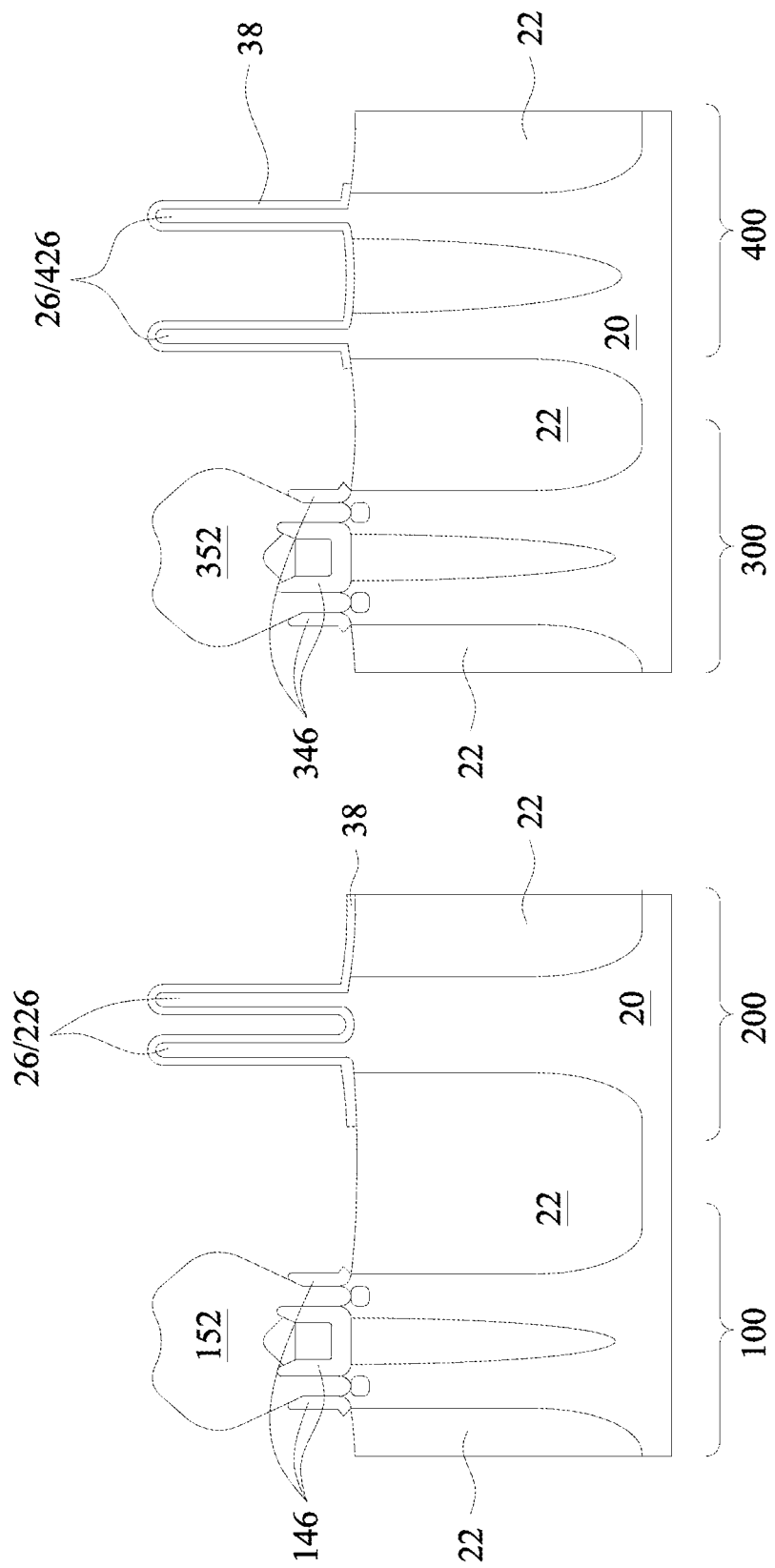
Figure 5C:
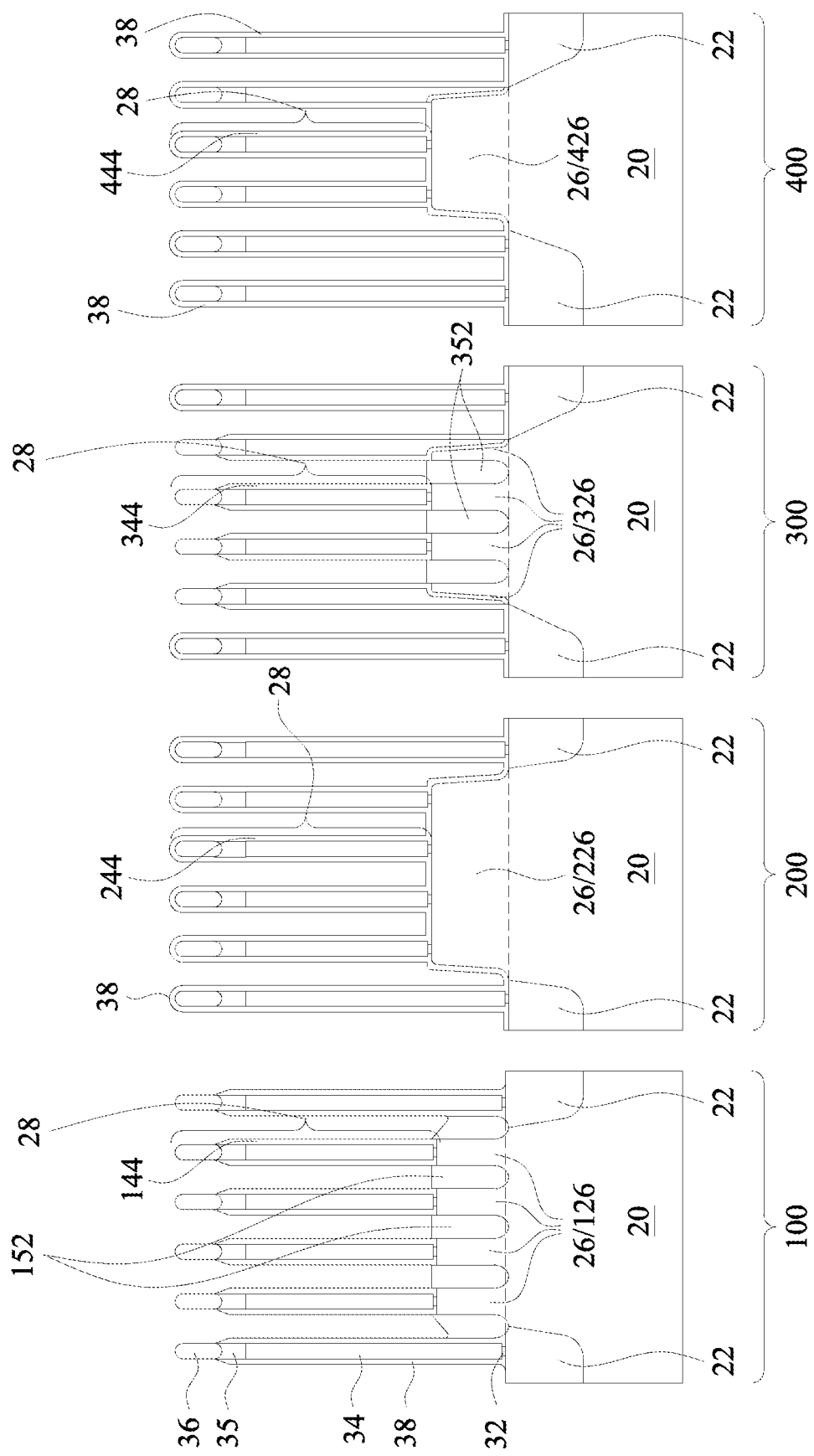

FIGS. 5A through 10C illustrate the formation of epitaxy regions for the FinFETs in regions 200 and 400, wherein the respective steps are similar to the repetition of the steps for forming epitaxy regions in device regions 100 and 300, except the conductivity types of some regions are inversed. First, an etching step is performed to remove remaining portions of mask layer 40 from regions 100, 200, 300, and 400. The respective step is illustrated as step 518 in the process flow shown in FIG. 12. Some residue portions of mask layer 40 may (or may not) be left after the etch. The resulting structure is shown in FIGS. 5A, 5B, and 5C.

Figure 6A:
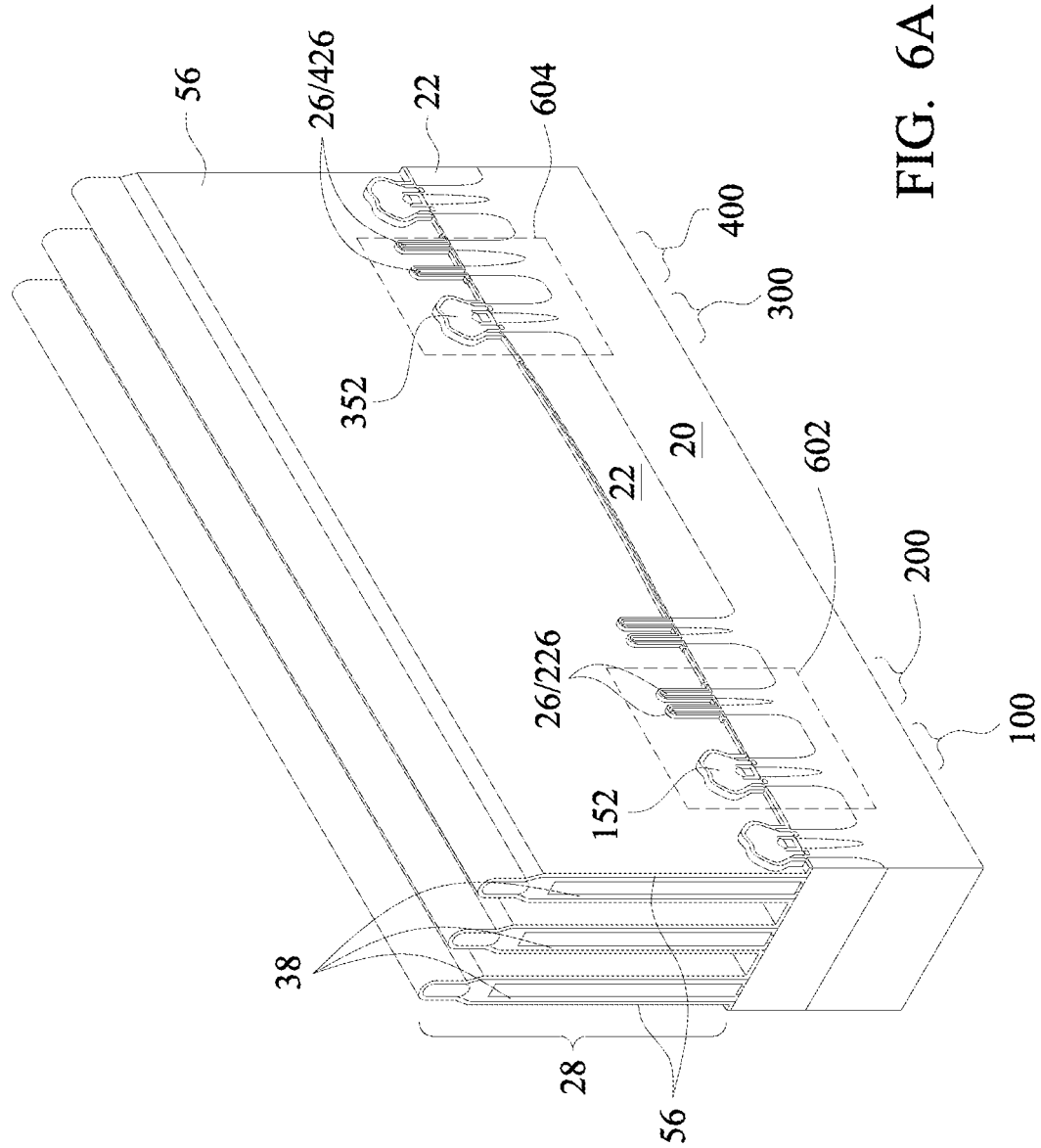
Figure 6B:
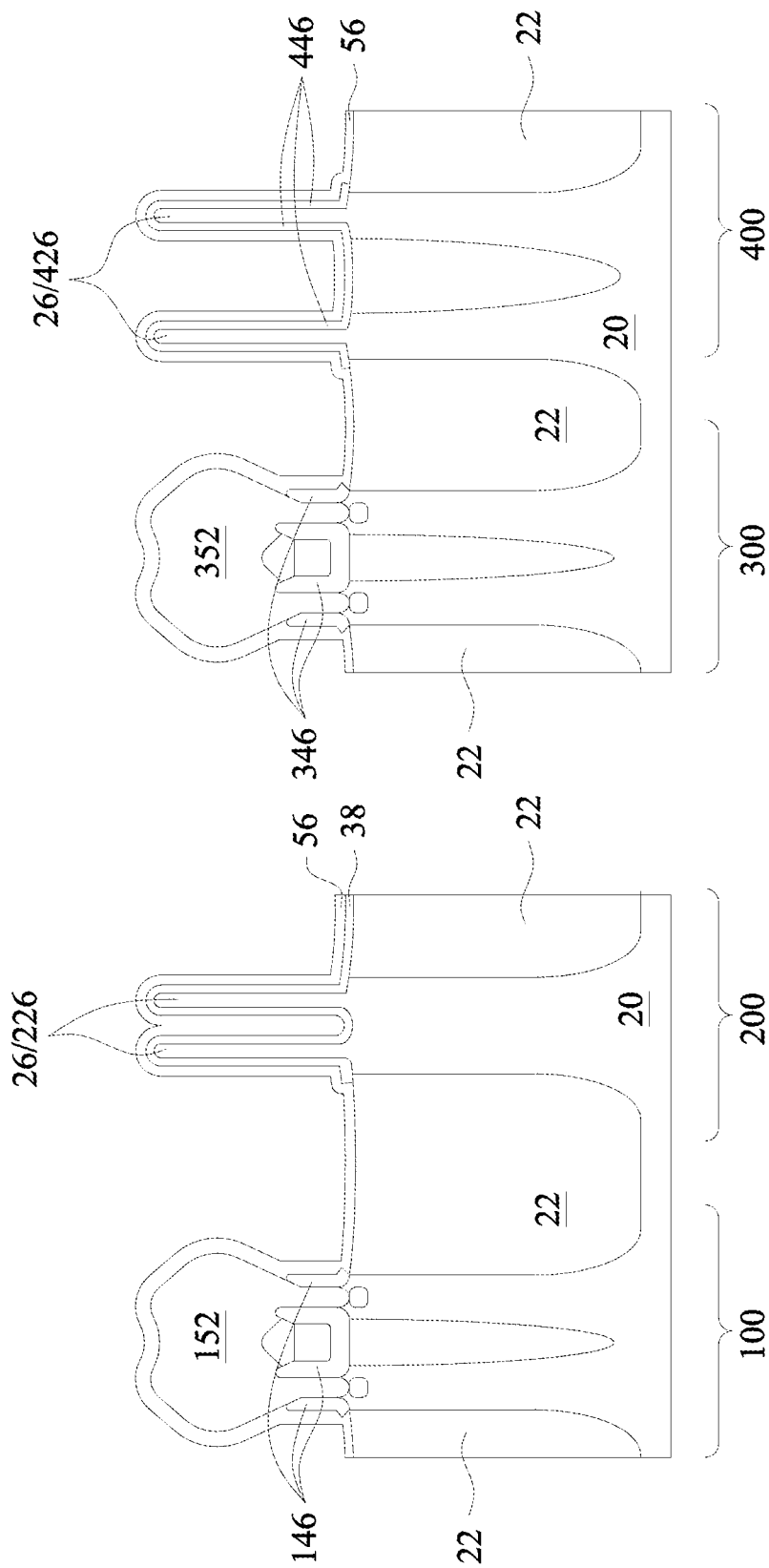
Figure 6C:
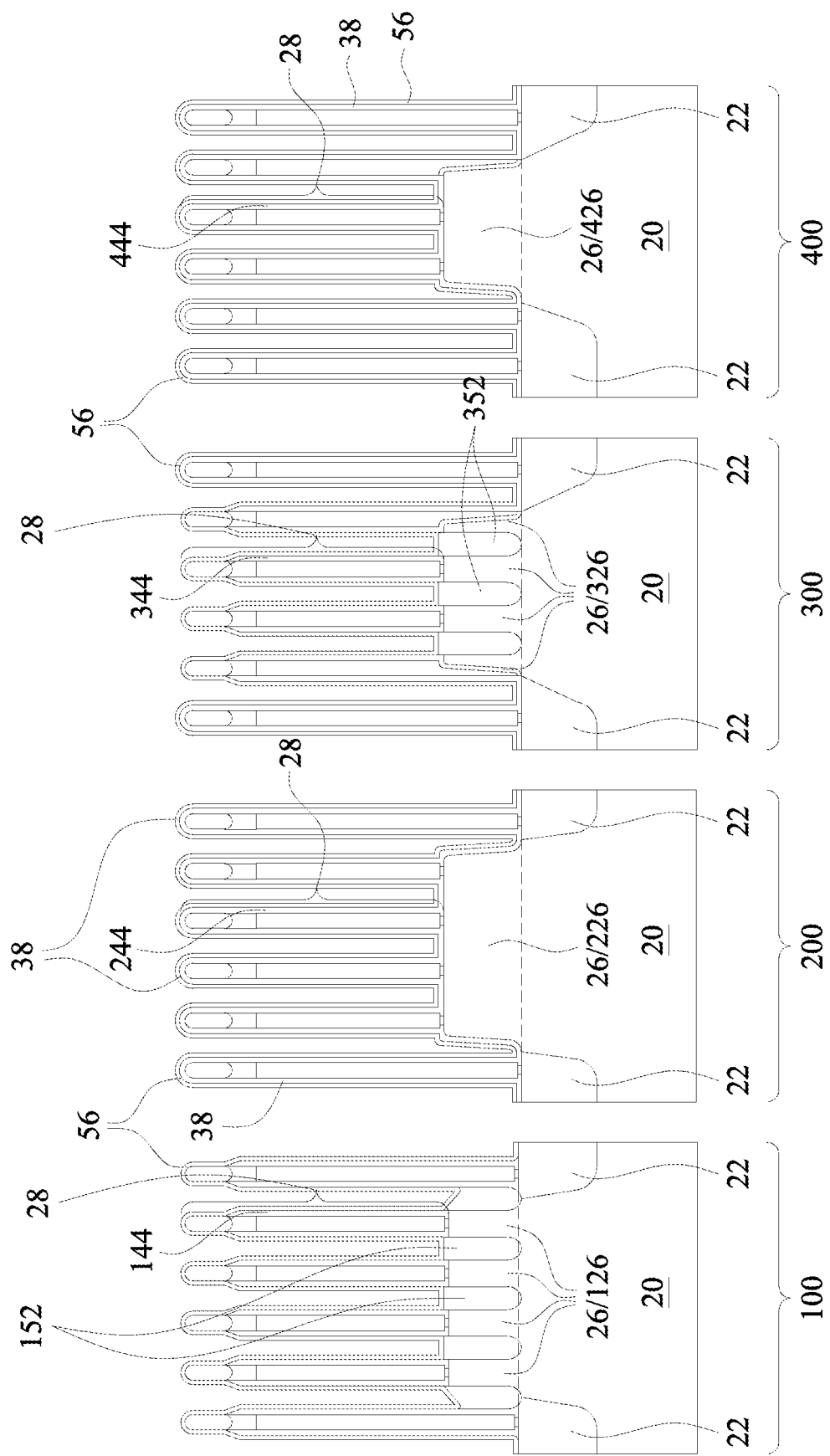

Next, as shown in FIGS. 6A, 6B, and 6C, mask layer 56 is formed. The respective step is illustrated as step 520 in the process flow shown in FIG. 12. The material and the formation methods of mask layer 56 may be selected from the same candidate materials and candidate methods for forming mask layer 40. For example, the material of mask layer 56 may be selected from silicon nitride, silicon oxide, SiCN, SiOCN, and SiON. Mask layer 56 may also be formed using ALD or CVD. The thickness of mask layer 56 may be in the range between about 2 nm and about 10 nm.

Figure 7A:
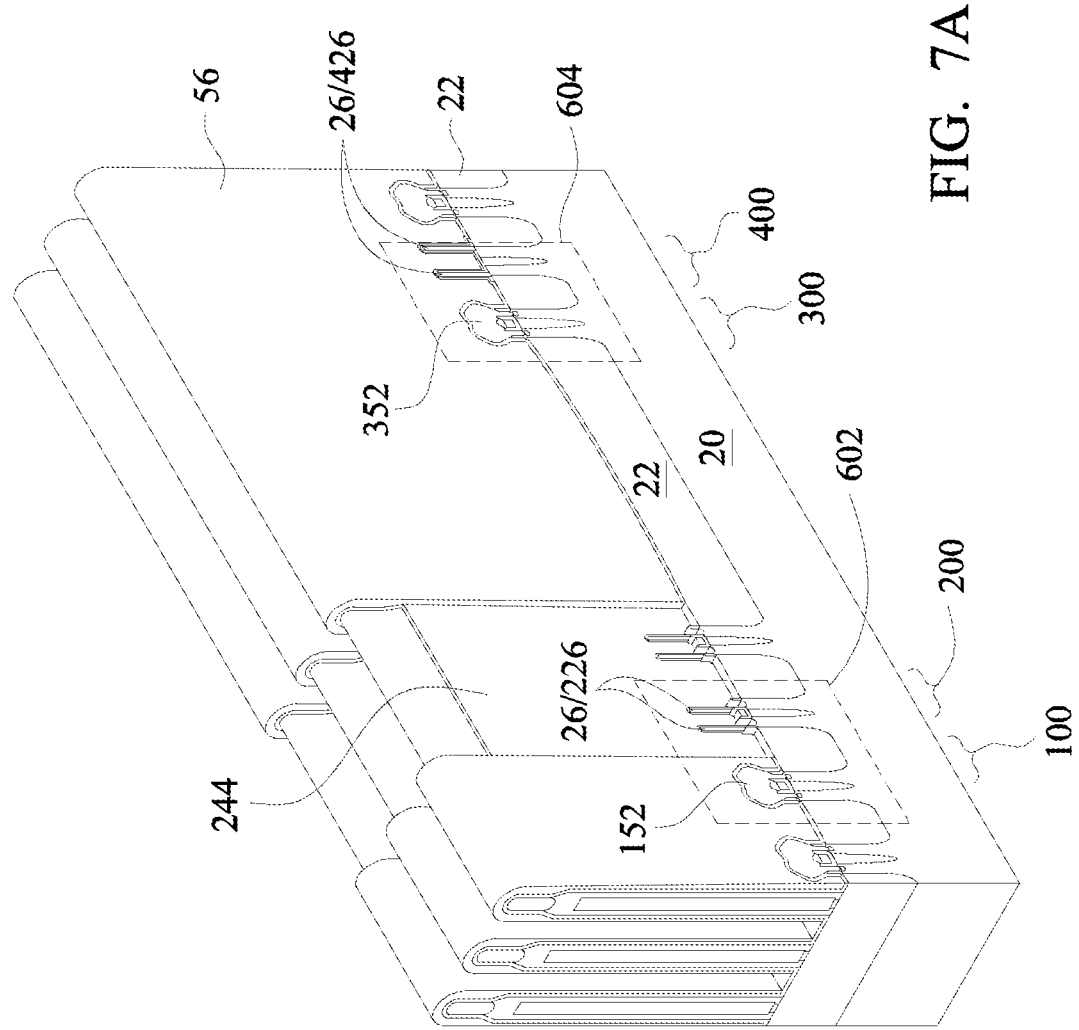
Figure 7B:
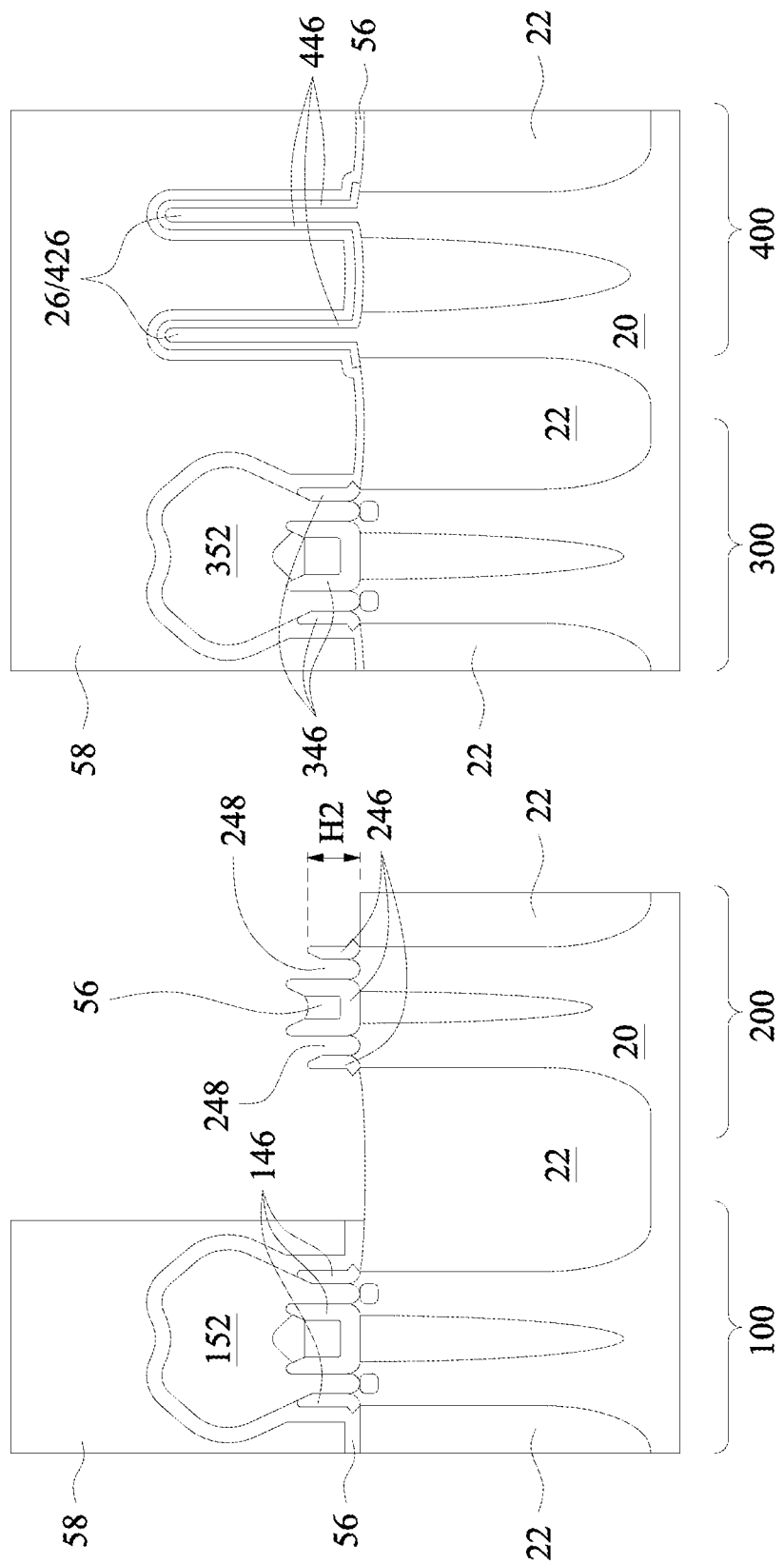
Figure 7C:
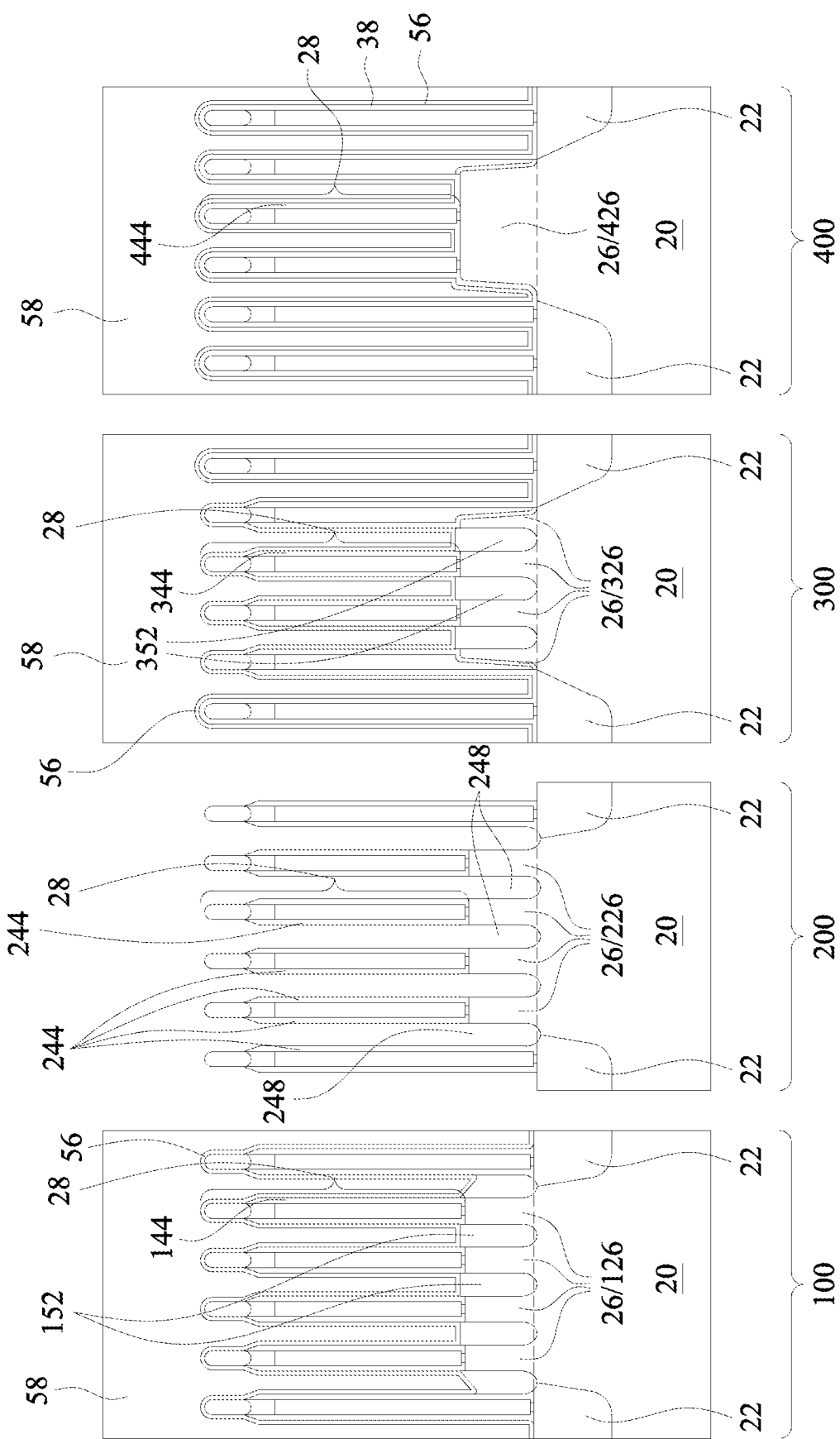

FIGS. 7A, 7B, and 7C illustrate the patterning of spacer layer 38 in region 200. First, photo resist 58 is applied and patterned, wherein the photo resist 58 is illustrated in FIGS. 7B and 7C, and not in FIGS. 7A, although it still exists in FIG. 7A. The patterned photo resist 58 covers regions 100, 300, and 400, and leaves region 200 uncovered. Next, an etching step is performed to remove the portions of mask layer 56 in region 200. Depending on the process and the distance between neighboring fins 226 (FIG. 2C), mask layer 56 may, or may not have a residue portion left between neighboring fins 226 (FIG. 7B). After mask layer 56 is removed, the portion of spacer layer 38 in region 200 is exposed, and an anisotropic etching is performed to etch spacer layer 38, so that the top portions of spacer layer 38 on top of fins 226 (FIG. 6B) are removed, hence exposing fins 226. The remaining portions of spacer layer 38 on the sidewalls of gate stacks 28 become gate spacers 244 (FIG. 7C), and the remaining portions of spacer layer 38 on the sidewalls of fins 226 (FIG. 7B) become fin spacers 246. The etching time of spacer layer 38 is selected so that fin spacers 246 have appropriate height H2 (FIG. 7B).

In a subsequent step, the exposed semiconductor fins 226 (FIG. 6B) are etched, for example, in an anisotropic or isotropic etching step, so that recesses 248 (FIGS. 7B and 7C) are formed to extend into semiconductor fins 226. The bottoms of recesses 248 may be higher than, level with, or lower than the top surfaces of STI regions 22. The etching is performed using an etchant that attacks fins 226, and hardly attacks fin spacers 246. Accordingly, in the etching step, the height H2 of fin spacers 246 is substantially not reduced. After the formation of recesses 248, photo resist 58 is removed.

Figure 8A:
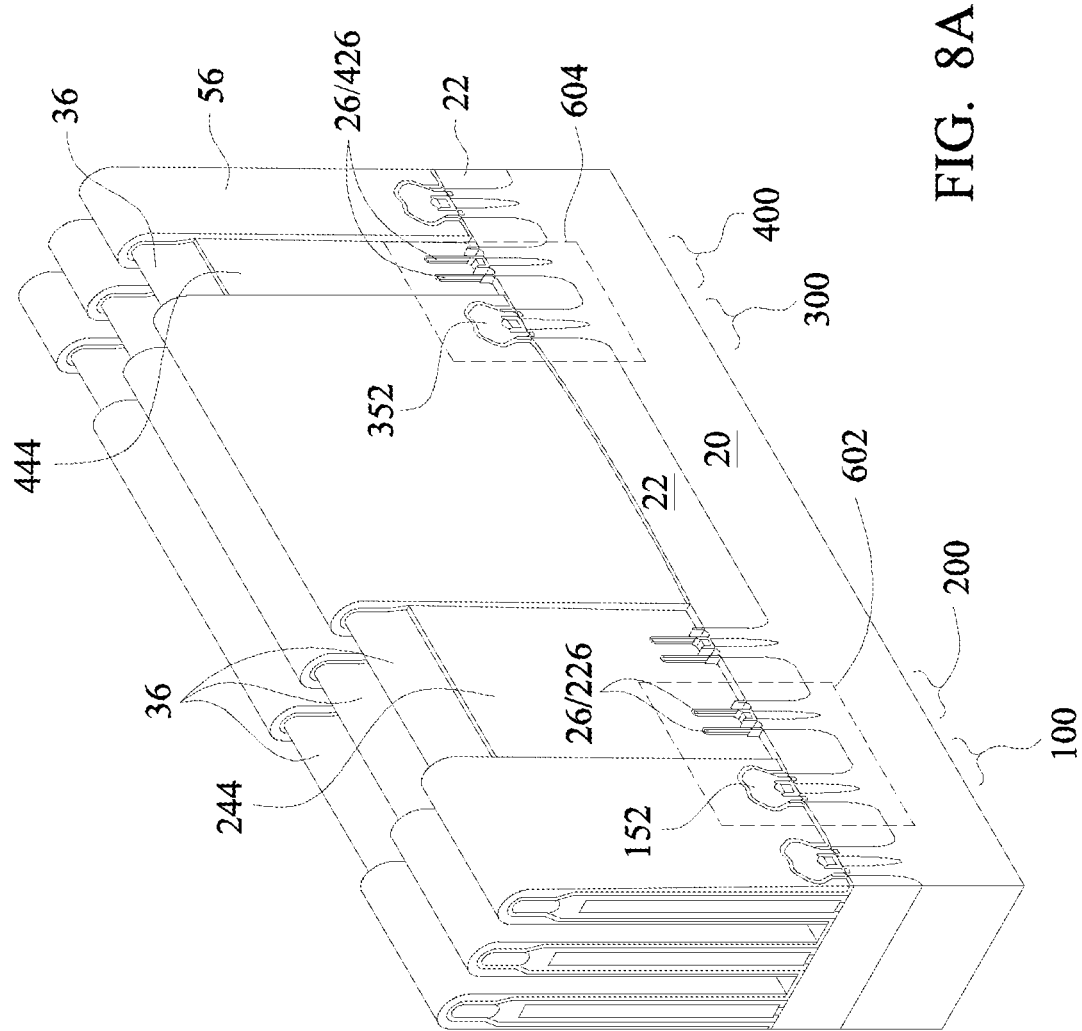
Figure 8B:
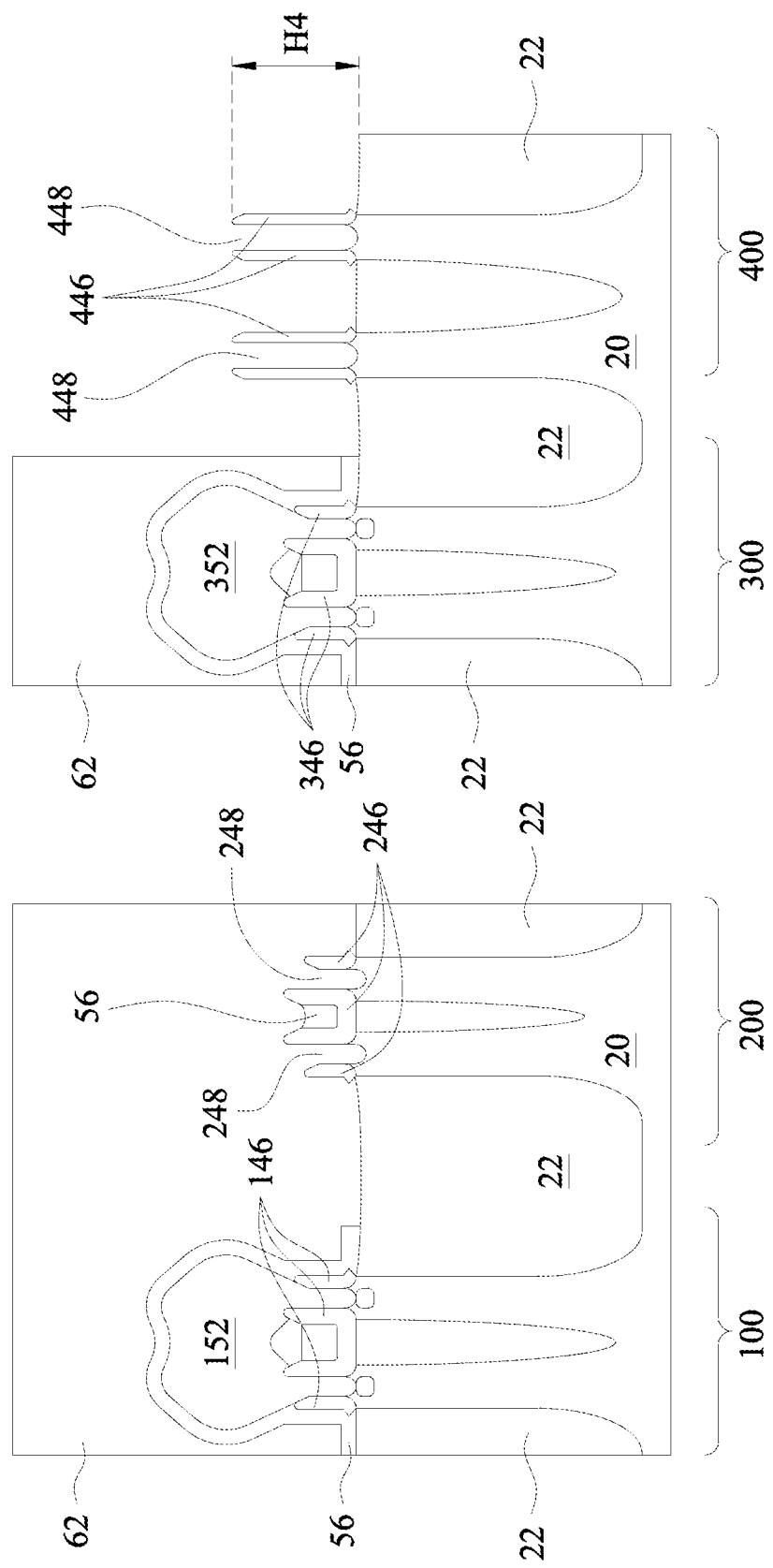
Figure 8C:
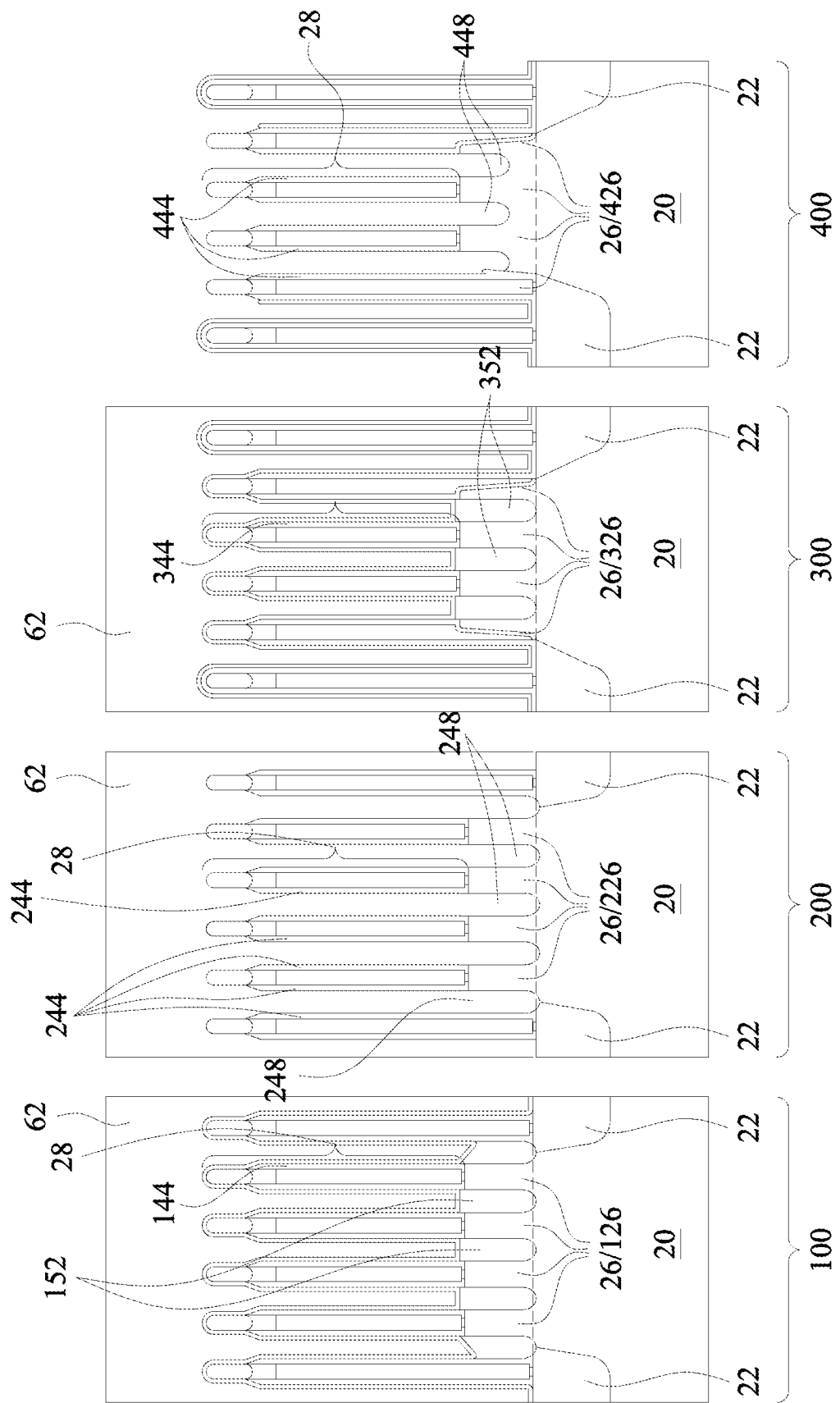

FIGS. 8A, 8B, and 8C illustrate the patterning of spacer layer 38 in region 400. First, photo resist 62 is applied and patterned, wherein the photo resist 62 is illustrated in FIGS. 8B and 8C, and not in FIGS. 8A, although it still exists in FIG. 8A. The patterned photo resist 62 covers regions 100, 200, and 300, and leaves region 40o uncovered. Next, an etching step is performed to remove the portions of mask layer 56 in region 400. Depending on the process and the distance D2' between neighboring fins 426 (FIG. 2C), mask layer 56 may, or may not have a residue portion left between neighboring fins 426 (FIG. 8B). After mask layer 56 is removed, the portion of spacer layer 38 in region 400 is exposed, and an anisotropic etching is performed to etch spacer layer 38, so that the top portions of spacer layer 38 on top of fins 426 (FIG. 7B) are removed, exposing fins 426. The remaining portions of spacer layer 38 on the sidewalls of gate stacks 28 become gate spacers 444 (FIG. 8C), and the remaining portions of spacer layer 38 on the sidewalls of fins 426 (FIG. 8B) become fin spacers 446. The etching time of spacer layer 38 is selected so that fin spacers 446 have appropriate height H4 (FIG. 8B).

In a subsequent step, the exposed semiconductor fins 426 (FIG. 7B) are etched, for example, in an anisotropic or isotropic etching step, so that recesses 448 (FIGS. 8B and 8C) are formed to extend into semiconductor fins 426. The bottoms of recesses 448 may be higher than, level with or lower than the top surfaces of STI regions 22. The etching is performed using an etchant that attacks fins 426, and hardly attack fin spacers 446. Accordingly, in the etching step, the height of fin spacers 446 is substantially not reduced. After the formation of recesses 448, photo resist 62 is removed.

Figure 9B:
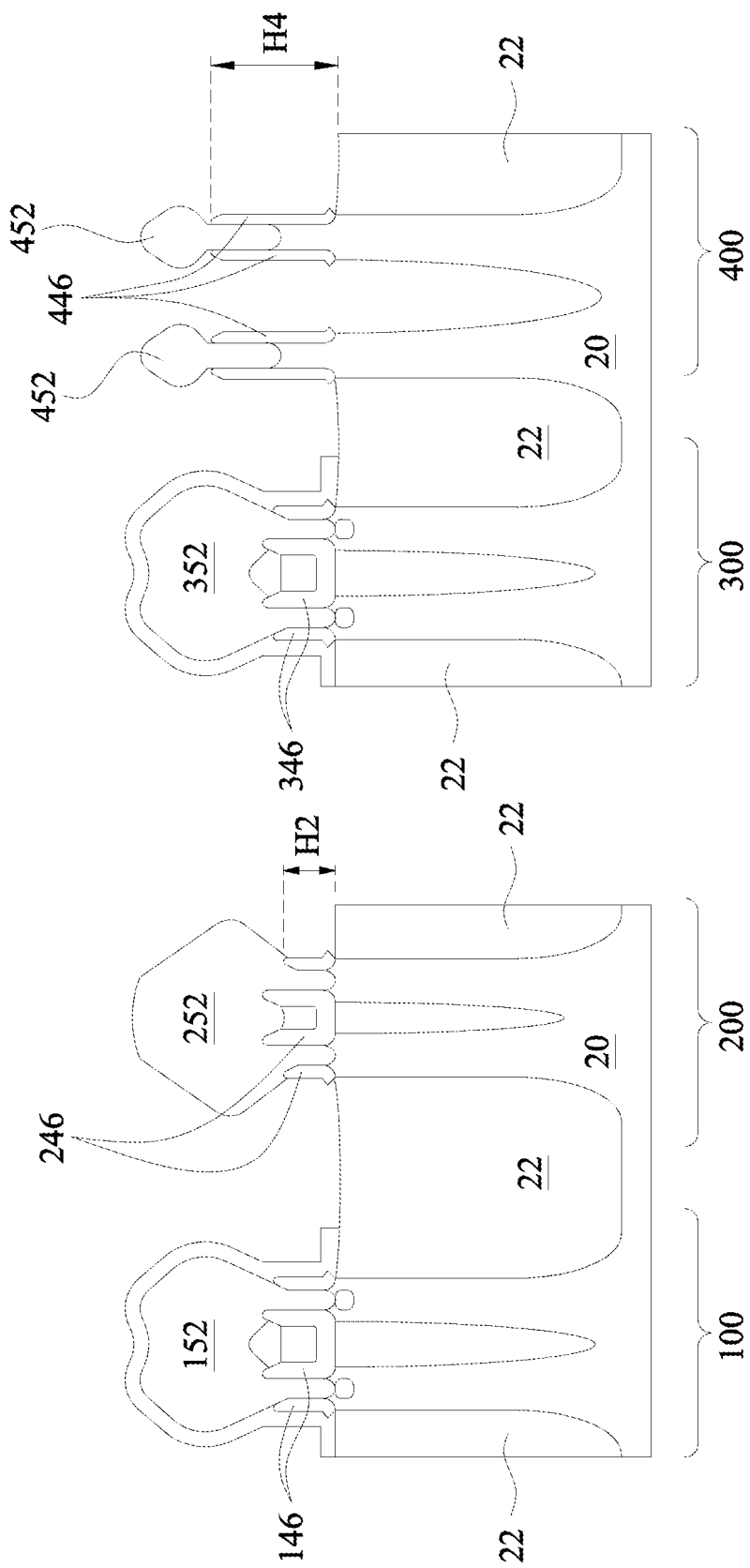
Figure 9C:
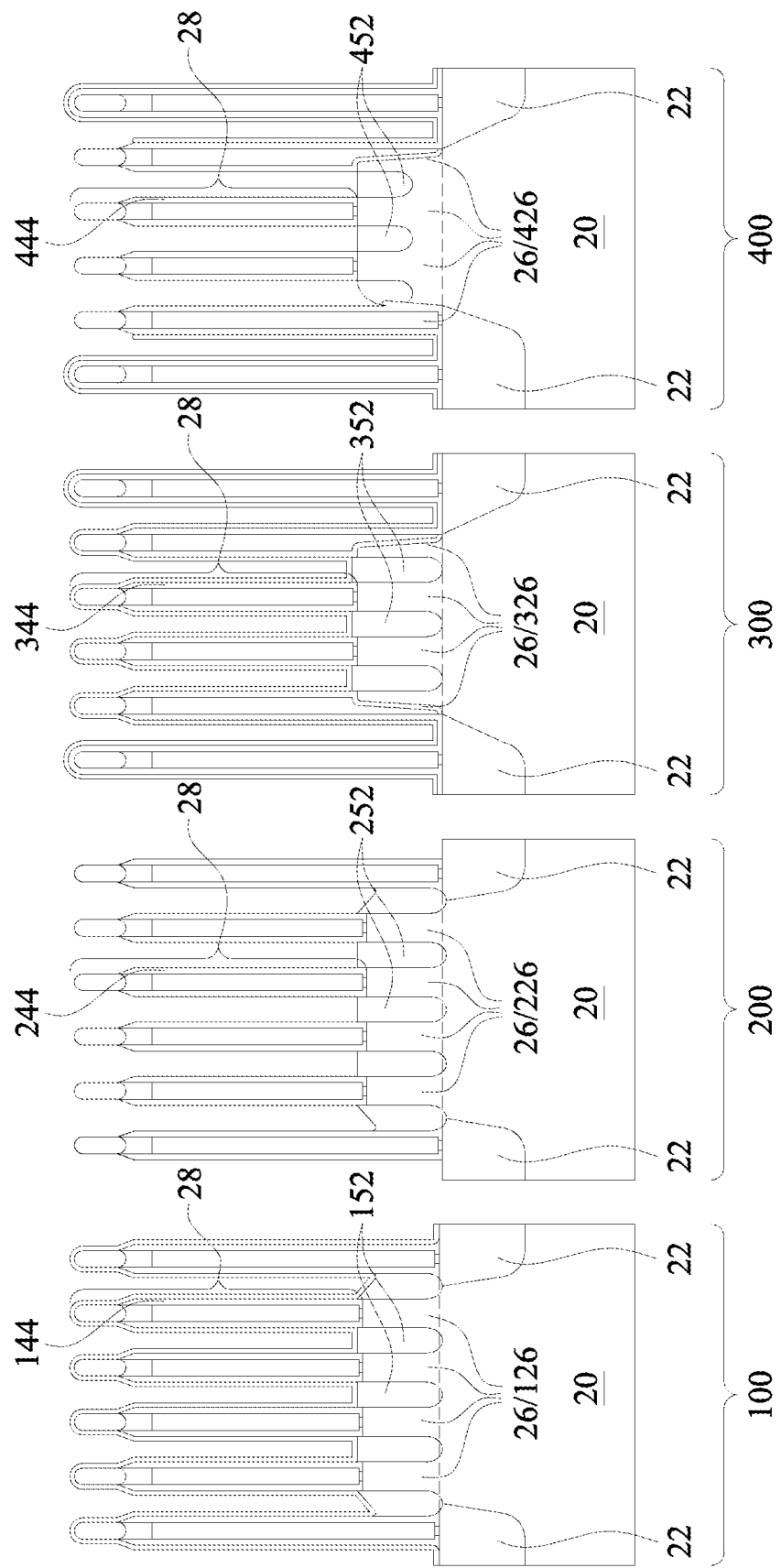

FIGS. 9A, 9B, and 9C illustrate the simultaneously epitaxy for forming epitaxy regions 252 and 452 (which are source/drain regions of FinFETs) in regions 200 and 400, respectively. In accordance with some embodiments of the present disclosure, the formation of epitaxy regions 252 and 452 includes epitaxially growing silicon germanium, wherein boron may be in-situ doped, so that the resulting FinFETs formed in regions 200 and 400 are p-type FinFETs. As also shown in FIG. 9B, in the initial stage of the epitaxy, the grown epitaxy regions 252 and 452 are confined by fin spacers 246 and 446, respectively. After epitaxy regions 252 and 452 are grown to higher than the top ends of epitaxy regions 252 and 452, respectively, lateral growth also occurs along with the vertical growth, and epitaxy regions 252 and 452 expand laterally.

The portions of epitaxy regions 252 grown from neighboring recesses 248 may be merged into a large epitaxy region. In accordance with some embodiments of the present disclosure, the portions of epitaxy regions 452 grown from neighboring recesses 148 are not merged. This is achieved by making height H4 (FIG. 9B) of fin spacers 446 to be greater than height H2 of fin spacers 246. To make height H4 to be greater than height H2, the period of time TP4 for etching spacer layer 38 (the step shown in FIG. 8B) may be selected to be shorter than the period of time TP2 for etching spacer layer 38 (the step shown in FIG. 7B). In accordance with some embodiments of the present disclosure, ratio TP2/TP4 may be greater than about 1.5, and may be in the range between about 1.5 and about 5.0. As a result, height H4/H2 may be greater than about 1.5, and may be in the range between about 1.5 and about 5.0.

In accordance with alternative embodiments, the processes for forming fin spacers 236 and 446 may be adjusted to adjust heights H2 and H4, and to result in one of the following results: the mergence occurs for both epitaxy regions 252 and 452 (height H2 and H4 are substantially equal, for example, with difference smaller than about 10 percent), the mergence occurs for epitaxy regions 452 but not for epitaxy regions 252 (with height H2>H4), and the mergence doesn't occur for either of epitaxy regions 252 and 452.

In accordance with some embodiments, after the epitaxy, an implantation is performed to implant a p-type impurity such as boron or indium into epitaxy regions 252 and 452 to form source/drain regions, which are also referred to using reference numerals 252 and 452. In accordance with alternative embodiments, no implantation of p-type impurity is performed.

Figure 10A:
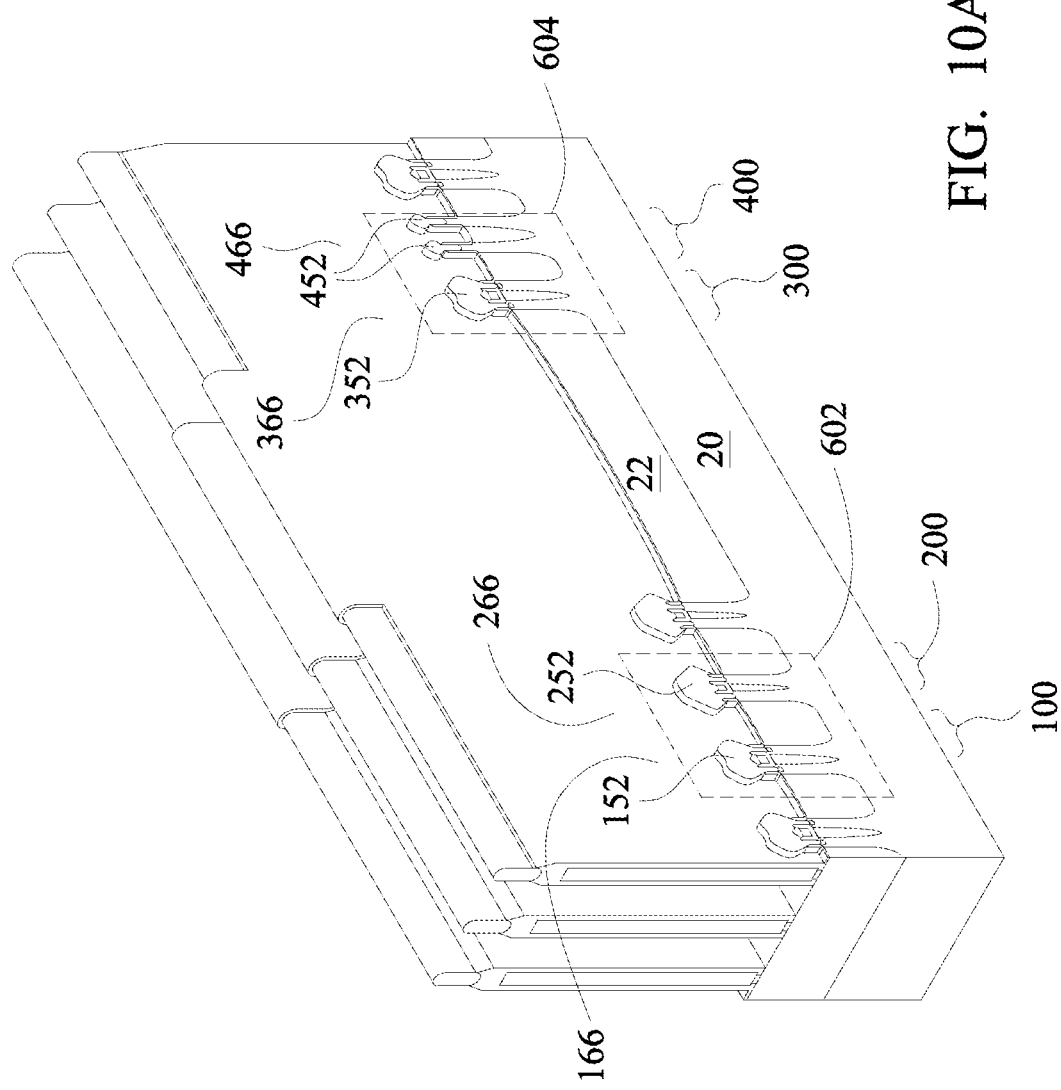
Figure 10B:
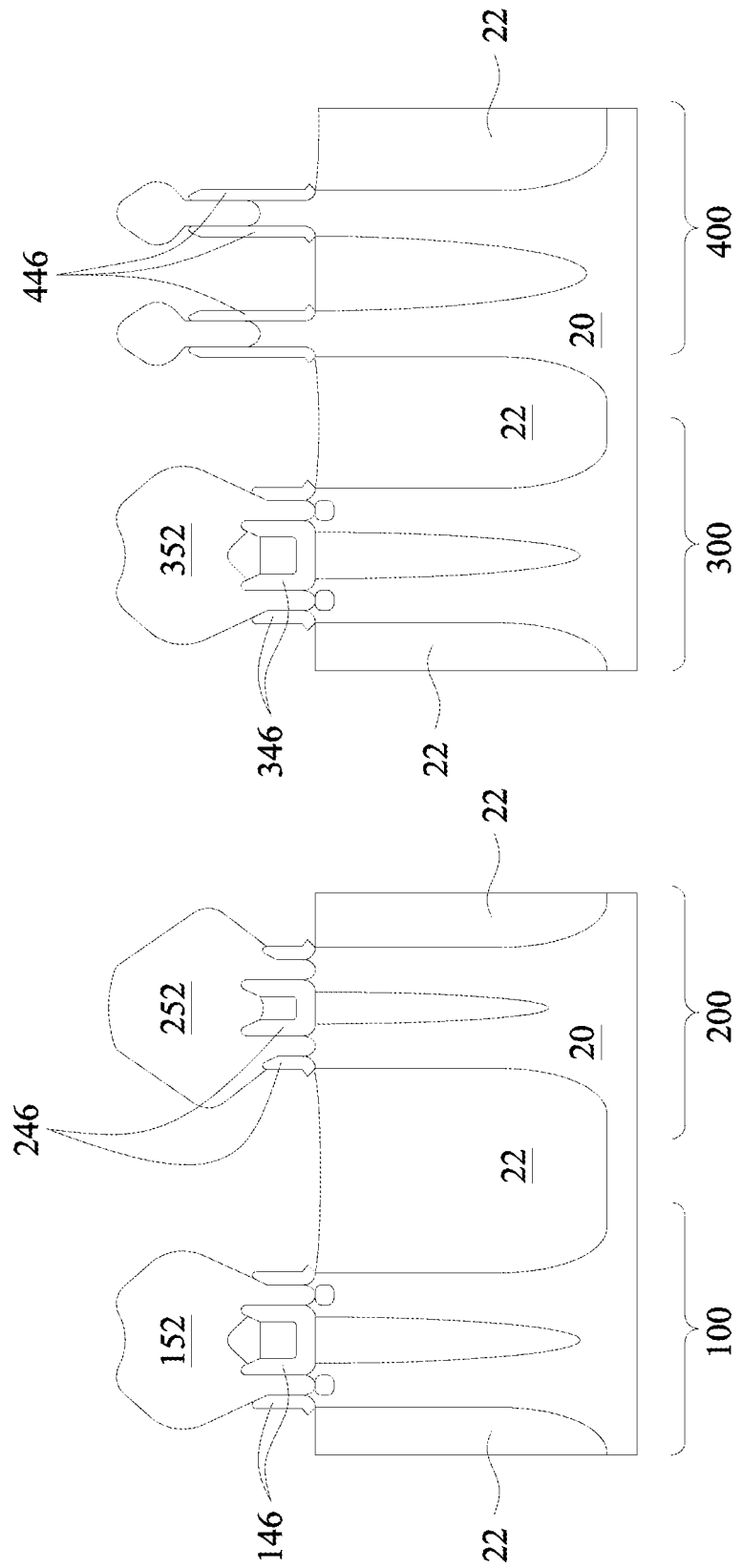
Figure 10C:
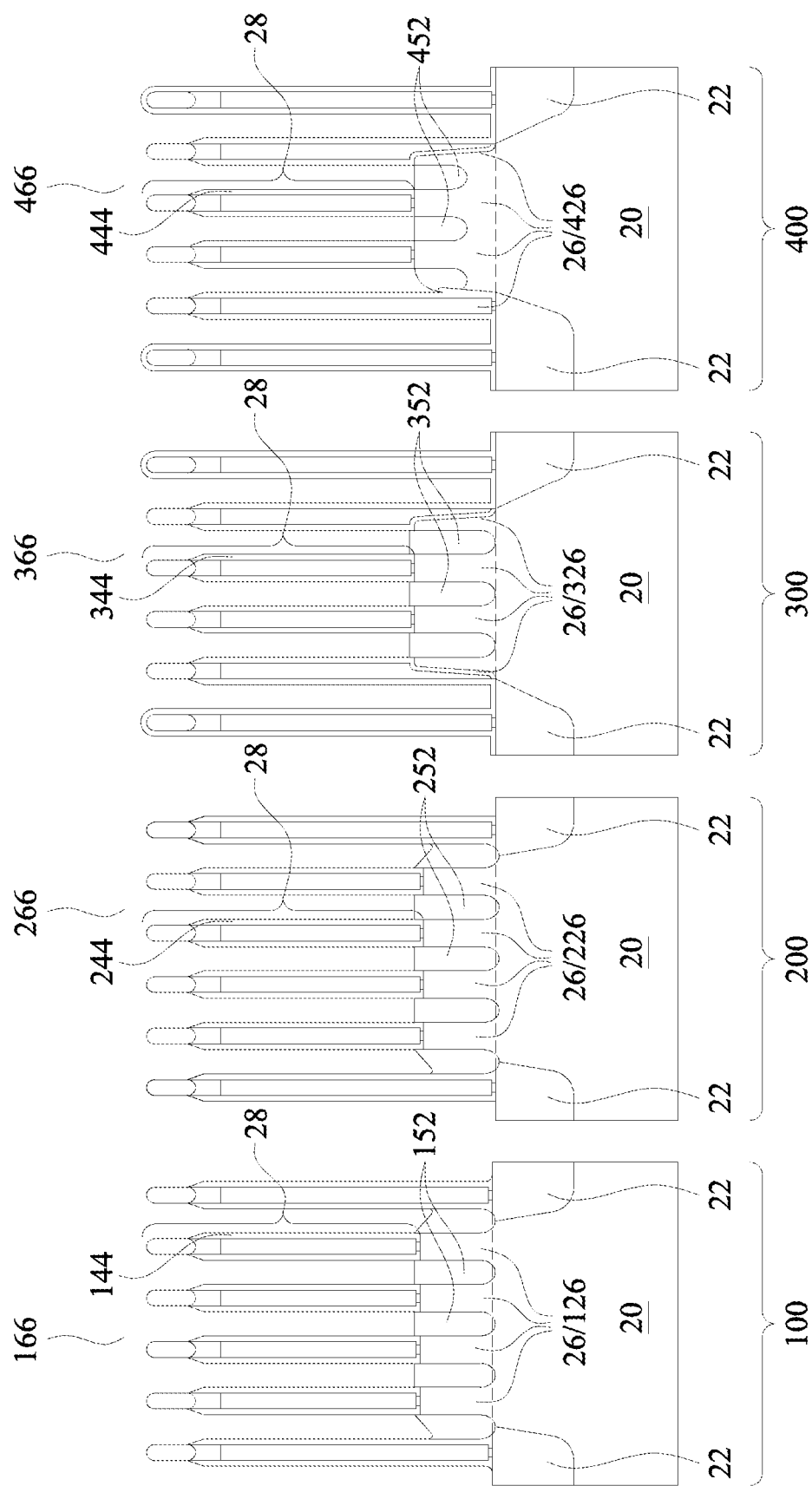
Figure 11:
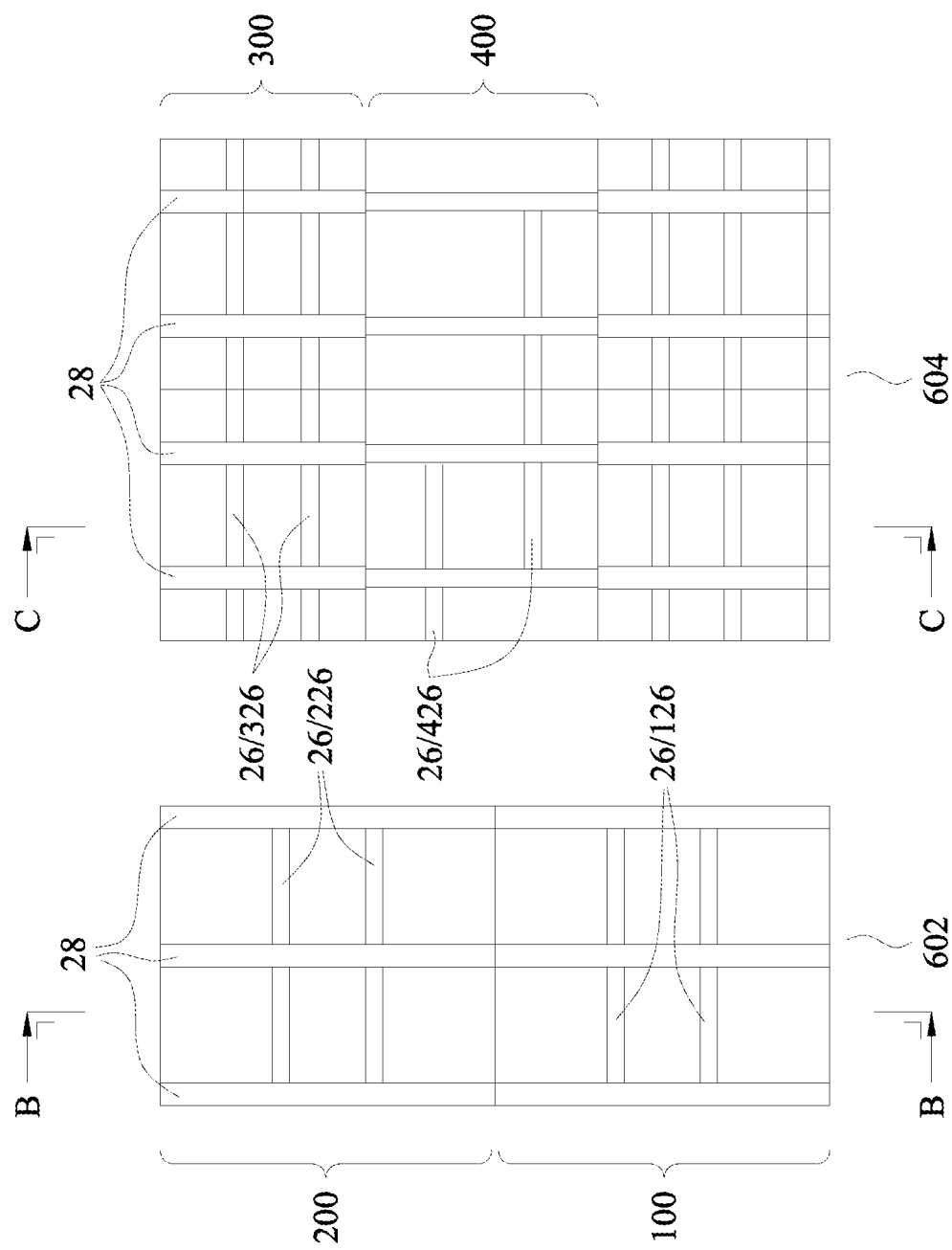
FIG. 11 illustrates the exemplary layouts of a logic circuit and a Static Random Access Memory (SRAM) circuit in accordance with some embodiments.

An etching step is then performed to remove remaining portions of mask layer 56 from regions 100, 200, 300, and 400, and FIGS. 10A, 10B, and 10C illustrate the structure after mask layer 56 is removed. N-type FinFET 166, p-type FinFET 266, n-type FinFET 366, and p-type FinFETs 466 are thus formed in regions 100, 200, 300, and 400, respectively. In subsequent steps, source/drain silicide regions (not shown) are formed on the top surfaces of source/drain regions 152, 252, 352, and 452. An Inter-Layer Dielectric (ILD, not shown) is formed to cover the illustrated FinFETs, and source/drain contact plugs (not shown) may be formed in the ILD to contact the source/drain silicide regions. Gate contact plugs (not shown) may also be formed to contact the illustrated gate electrodes in gate stacks 28. Also, the illustrate gate stacks 28 may be replaced with replacement gate stacks if gate stacks 28 are dummy gate stacks.

The embodiments of the present disclosure have some advantageous features. By separating the formation of fin spacers in different device regions, the heights of the fin spacers in different device regions may be adjusted separately. This advantageously results in the flexibility in forming merged or un-merged epitaxy source/drain regions. The formation of the fin spacers shares a common deposition process, and the epitaxy for forming source/drain regions for different device regions is also a common process. The manufacture cost is thus reduced.

In accordance with some embodiments of the present disclosure, a method includes forming a first gate stack extending on top surfaces and sidewalls of first semiconductor fins with the first semiconductor fins being parallel to and neighboring each other, forming a second gate stack extending on top surfaces and sidewalls of second semiconductor fins with the second semiconductor fins being parallel to and neighboring, each other, and forming a dielectric layer. The dielectric layer includes a first portion extending on the first gate stack and the first semiconductor fins, and a second portion extending on the second gate stack and the second semiconductor fins. In a first etching process, the first portion of the dielectric layer is etched to form first fin spacers on sidewalls of the first semiconductor fins. The first fin spacers have a first height. In a second etching process, the second portion of the dielectric layer is etched to form second fin spacers on sidewalls of the second semiconductor fins. The second fin spacers have a second height greater than the first height. The first semiconductor fins are recessed to form first recesses between the first fin spacers. The second semiconductor fins are recessed to form second recesses between the second fin spacers. The method further includes simultaneously growing first epitaxy semiconductor regions from the first recesses and second epitaxy semiconductor regions from the second recesses. The first epitaxy semiconductor regions grown from neighboring ones of the first recesses merge with each other. The second epitaxy semiconductor regions grown from neighboring ones of the second recesses are separate from each other.

In accordance with some embodiments of the present disclosure, a method includes etching a first semiconductor fin and a second semiconductor fin to form first recesses. The first and the second semiconductor fins have a first distance. A third semiconductor fin and a fourth semiconductor fin are etched to form second recesses. The third and the fourth semiconductor fins have a second distance equal to or smaller than the first distance. An epitaxy is performed to simultaneously grow first epitaxy semiconductor regions from the first recesses and second epitaxy semiconductor regions from the second recesses. The first epitaxy semiconductor regions are merged with each other, and the second epitaxy semiconductor regions are separated from each other.

In accordance with some embodiments of the present disclosure, a method includes, in a common deposition process, forming a dielectric layer including a first portion on top surfaces and sidewalls of first semiconductor fins and a second portion on top surfaces and sidewalls of second semiconductor fins. In separate etching processes, the first portion of the dielectric layer and the second portion of the dielectric layer are etched to form first fin spacers and second fin spacers, respectively. The first fin spacers have a first height, and the second fin spacers have a second height greater than the first height. The first semiconductor fins are etched to form first recesses between the first fin spacers. The second semiconductor fins are etched to form second recesses between the second fin spacers. In a common epitaxy process, first epitaxy semiconductor regions are growth from the first recesses, and second epitaxy semiconductor regions are grown from the second recesses. The first epitaxy semiconductor regions merge with each other, and the second epitaxy semiconductor regions are discrete from each other.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   depositing a spacer layer comprising first portions on first semiconductor fins, and second portions on second semiconductor fins;
   forming first fin spacers on opposing sides of the first semiconductor fins;

forming second fin spacers on opposing sides of the second semiconductor fins, wherein the second fin spacers are taller than the first fin spacers; and performing an epitaxy process to simultaneously grow first epitaxy semiconductor regions based on the first semiconductor fins and second epitaxy semiconductor regions based on the second semiconductor fins, wherein when the first epitaxy semiconductor regions grown from neighboring ones of the first semiconductor fins start to merge with each other, the second epitaxy semiconductor regions grown from neighboring ones of the second semiconductor fins are separated from each other.

2. The method of claim 1, wherein at a time when the epitaxy process is finished, the second epitaxy semiconductor regions grown from neighboring ones of the second semiconductor fins are separated from each other.

3. The method of claim 1, wherein the forming the first fin spacers comprises performing a first etching process on a first spacer layer, and the forming the second fin spacers comprises performing a second etching process on a second spacer layer.

4. The method of claim 3, wherein the first etching process and the second etching process are separate etching processes.

5. The method of claim 4, wherein the first etching process lasts longer than the second etching process.

6. The method of claim 1, wherein the first fin spacers have a first height, and the second fin spacers have a second height greater than the first height.

7. The method of claim 6, wherein the second height of the second fin spacers is greater than about 1.5 times the first height of the first fin spacers.

8. The method of claim 1, wherein neighboring fins in the first semiconductor fins have a first distance, and neighboring fins in the second semiconductor fins have a second distance equal to the first distance.

9. The method of claim 1, wherein neighboring fins in the first semiconductor fins have a first distance, and neighboring fins in the second semiconductor fins have a second distance smaller than the first distance.

10. The method of claim 1, wherein the first semiconductor fins overlap first semiconductor strips that are in first isolation regions, and the second semiconductor fins overlap second semiconductor strips that are in second isolation regions, and wherein the method further comprises:

etching the first semiconductor fins to form first recesses between the first fin spacers, wherein the first epitaxy semiconductor regions are grown from the first recesses; and etching the second semiconductor fins to form second recesses between the second fin spacers, wherein the second epitaxy semiconductor regions are grown from the second recesses.

11. A method comprising:

forming first fin spacers on opposing sides of a first semiconductor strip and a second semiconductor strip;

forming second fin spacers on opposing sides of a third semiconductor strip and a fourth semiconductor strip, wherein the second fin spacers are taller than the first fin spacers; and forming first epitaxy semiconductor regions from the first semiconductor strip and the second semiconductor strip, wherein the first epitaxy semiconductor regions are merged with each other; and forming second epitaxy semiconductor regions from the third semiconductor strip and the fourth semiconductor strip, and the second epitaxy semiconductor regions are separated from each other when the forming the second epitaxy semiconductor regions is ended.

12. The method of claim 11, wherein the first semiconductor strip and the second semiconductor strip have a first distance from each other, and wherein the third semiconductor strip and the fourth semiconductor strip have a second distance from each other, with the second distance being equal to or smaller than the first distance.

13. The method of claim 12, wherein the second distance is smaller than the first distance.

14. The method of claim 11, wherein the first epitaxy semiconductor regions and the second semiconductor epitaxy regions are comprised in a first Fin Field-Effect Transistor (FinFET) and a second FinFET, respectively.

15. The method of claim 11, wherein the first epitaxy semiconductor regions and the second epitaxy semiconductor regions are epitaxially grown in a same epitaxy process.

16. The method of claim 11 further comprising depositing a dielectric layer on tops and opposing sides of the first, the second, the third, and the fourth semiconductor strips, wherein: the forming the first fin spacers and the forming the second fin spacers comprise a first etching process for forming the first fin spacers, and a second etching process for forming the second fin spacers.

17. The method of claim 16, wherein the first etching process and the second etching process are performed at different times.

18. The method of claim 16, wherein the first fin spacers and the second fin spacers are formed in separate lithography processes using separate photoresists.

19. A method comprising:

forming first fin spacers on sidewalls of first semiconductor fins;

forming second fin spacers on sidewalls of second semiconductor fins, wherein a first spacing between two immediate neighboring ones of the first semiconductor fins is greater than a second spacing between two immediate neighboring ones of the second semiconductor fins, and wherein the first fin spacers have a first height, and the second fin spacers have a second height different from the first height;

recessing the first semiconductor fins;

recessing the second semiconductor fins; and in a common epitaxy process, growing first epitaxy semiconductor regions from the recessed first semiconductor fins and second epitaxy semiconductor regions from the recessed second semiconductor fins.

20. The method of claim 19, wherein at a time the common epitaxy process is ended, the first epitaxy semiconductor regions merge with each other, and the second epitaxy semiconductor regions are separate from each other.

* * * * *